(12) United States Patent
Motz

(10) Patent No.: US 11,860,047 B2
(45) Date of Patent: Jan. 2, 2024

(54) DEVICE AND METHOD FOR ASCERTAINING A MECHANICAL STRESS COMPONENT BY MEANS OF A HALL SENSOR CIRCUIT

(71) Applicant: Infineon Technologies AG, Neubiberg (DE)

(72) Inventor: Mario Motz, Wernberg (AT)

(73) Assignee: Infineon Technologies AG, Neubiberg (DE)

( * ) Notice: Subject to any disclaimer, the term of this patent is extended or adjusted under 35 U.S.C. 154(b) by 68 days.

(21) Appl. No.: 17/303,055

(22) Filed: May 19, 2021

(65) Prior Publication Data

US 2021/0372865 A1   Dec. 2, 2021

(30) Foreign Application Priority Data

May 26, 2020  (DE) .......................... 102020206571.3

(51) Int. Cl.
  *G01R 33/07*  (2006.01)
  *G01L 1/12*  (2006.01)
  (Continued)

(52) U.S. Cl.
  CPC ................ *G01L 1/12* (2013.01); *G01R 15/20* (2013.01); *G01R 19/0092* (2013.01)

(58) Field of Classification Search
  CPC ........ G01R 15/20; G01R 19/0092; G01L 1/12
  See application file for complete search history.

(56) References Cited

U.S. PATENT DOCUMENTS 9,857,247 B2  1/2018  Huber
9,864,038 B2  1/2018  Fujita
(Continued)

FOREIGN PATENT DOCUMENTS

DE  19858868 C2  6/2003
JP  2014041093 A  3/2017

OTHER PUBLICATIONS

Bartholomeyczik et al., "The continuous spinning current (CSC) stress sensor method for the extraction of two stress components in an offset compensated manner", Mar. 1, 2005, 6 pages.
(Continued)

*Primary Examiner* — Alesa Allgood
(74) *Attorney, Agent, or Firm* — Harrity & Harrity, LLP

(57) ABSTRACT

The subject matter described herein relates to a semiconductor circuit arrangement with a semiconductor substrate with an integrated Hall sensor circuit. During a first clock phase $PH_{spin1}$ a first electrical voltage signal $\pm V_{Hallout}(PH_{spin1})$ or $\pm V_{Hallbias}(PH_{spin1})$ can be generated in the Hall effect region that has a first dependency on a mechanical stress of the semiconductor substrate. During a second clock phase $PH_{spin2}$ a second electrical voltage signal $\pm V_{Hallout}(PH_{spin2})$ or $\pm V_{Hallbias}(PH_{spin2})$ can be generated in the Hall effect region that has a second dependency on a mechanical stress of the semiconductor substrate. The semiconductor circuit arrangement is designed to ascertain a specific mechanical stress component based on a combination of the first electrical voltage signal $\pm V_{Hallout}(PH_{spin1})$ or $\pm V_{Hallbias}(PH_{spin1})$ and of the second electrical voltage signal $\pm V_{Hallout}(PH_{spin2})$ or $\pm V_{Hallbias}(PH_{spin2})$.

20 Claims, 20 Drawing Sheets

(51) Int. Cl.
  *G01R 15/20* (2006.01)
  *G01R 19/00* (2006.01)

(56) References Cited

U.S. PATENT DOCUMENTS

| | | |
|---|---|---|
| 2008/0111565 A1 | 5/2008 | Ausserlechner et al. |
| 2009/0108839 A1 | 4/2009 | Ausserlechner |
| 2012/0200290 A1* | 8/2012 | Ausserlechner ..... G01R 33/075 324/251 |

OTHER PUBLICATIONS

Husstedt et al., "In-situ measurement of curvature and mechanical stress of packaged silicon", Nov. 2010, 6 pages.

Motz M., et al., "Electrical Compensation of Mechanical Stress Drift in Precision Analog Circuits," Wideband Continuous-time ADCs, Automotive Electronics, and Power Management, Jan. 2017, 31 pages.

* cited by examiner

Applying a Hall supply current (102) during a first clock phase ($PH_{spin1}$) between the first terminal (111) and the opposite, second terminal (112) in order to guide the Hall supply current (102) at a first angle ($\Phi_1$) to a normal to a primary flat plane of the semiconductor substrate, laterally through a Hall effect region of the Hall sensor circuit (101), wherein the Hall supply current (102) generates a first electrical voltage signal ($V_{Hallout}(PH_{spin1})$) or $V_{Hallbias}(PH_{spin1})$) in the Hall effect region, wherein the first electrical voltage signal ($V_{Hallout}(PH_{spin1})$) or $V_{Hallbias}(PH_{spin1})$) has a first dependency on a mechanical stress of the semiconductor substrate — 901

Applying a Hall supply current (102) during a second clock phase ($PH_{spin2}$) between the third terminal (113) and the opposite, fourth terminal (114) in order to guide the Hall supply current (102) at a second angle $\Phi_2$ (e.g. $\Phi_2 = -45°$ or $\Phi_2 = 90°$) orthogonal to the first angle $\Phi_1$ (e.g. $\Phi_1 = +45°$ or $\Phi_1 = 0°$), laterally through the Hall effect region of the Hall sensor circuit (101), wherein the Hall supply current (102) generates a second electrical voltage signal ($V_{Hallout}(PH_{spin2})$ or $V_{Hallbias}(PH_{spin2})$) in the Hall effect region, wherein the second electrical voltage signal ($V_{Hallout}(PH_{spin2})$ or $V_{Hallbias}(PH_{spin2})$) has a second dependency on a mechanical stress of the semiconductor substrate — 902

Ascertaining a specific mechanical stress component on the basis of a combination of the first electrical voltage signal ($V_{Hallout}(PH_{spin1})$ or $V_{Hallbias}(PH_{spin1})$) and of the second electrical voltage signal ($V_{Hallout}(PH_{spin2})$ or $V_{Hallbias}(PH_{spin2})$) — 903

Fig. 9

DEVICE AND METHOD FOR ASCERTAINING A MECHANICAL STRESS COMPONENT BY MEANS OF A HALL SENSOR CIRCUIT

CROSS REFERENCE TO RELATED APPLICATION

This application claims priority to German Patent Application No. 102020206571.3 filed on May 26, 2020, the content of which is incorporated by reference herein in its entirety.

BRIEF DESCRIPTION

The subject matter described herein relates to a device and to a method for ascertaining a mechanical stress component, and in particular of a shear stress and/or a normal stress, making use of a Hall sensor circuit. The mechanical stress component ascertained using the Hall sensor circuit can be used, for example, to compensate for a negative effect of this mechanical stress component on the parametric accuracy and/or parametric stability of another device, e.g. one that is separate from the Hall sensor circuit. This means that the Hall sensor circuit can be used to ascertain mechanical stress components that can then in turn be used to have an effect on other devices.

The Hall sensor circuit can be an integrated circuit on a semiconductor substrate as part of a circuit arrangement. In addition to the Hall sensor circuit, additional, further components and/or additional, further integrated circuit arrangements can be present on the semiconductor substrate. Integrated circuit arrangements or integrated circuits (ICs) are usually mounted in packages in order to protect the delicate integrated circuit arrangements from environmental influences. It is, however, observable as an unfortunate side-effect that even the placement and mounting of the integrated circuit arrangement in a package can exert a significant mechanical stress on the semiconductor material and thereby on the semiconductor substrate of the integrated circuit arrangement. This relates in particular to low-cost package forms configured as mass-produced items such as, for example, for those package forms in which the integrated circuit arrangement is encapsulated by a potting compound. The potting compound then cures as the potting compound cools to the ambient temperature starting from a temperature of about 150° C.-185° C.

Since the semiconductor material of the integrated circuit arrangement and the synthetic potting material of the package that surrounds the integrated circuit arrangement have non-identical coefficients of thermal expansion, the synthetic material shrinks more markedly as it cools to the ambient temperature, for example room temperature, and exerts a largely non-reproducible mechanical stress on the semiconductor material of the integrated circuit arrangement. The synthetic material generally has a larger coefficient of thermal expansion than the semiconductor material of the integrated circuit arrangement; usually silicon, or also germanium, gallium arsenide (GaAs), InSb, InP and so on, can be used as semiconductor materials.

The mechanical stress in the semiconductor material of the semiconductor substrate, which has an effect on the integrated circuit arrangement, can therefore in general only be reproduced poorly, since the mechanical stress depends on the combination of the materials used for the semiconductor substrate and for the potting compound, and moreover on the processing parameters such as, for example, the curing temperature and the curing duration of the compound mass of the package of the integrated circuit arrangement.

As a result of various piezo effects in the semiconductor material such as, for example, the piezo-resistive effect, the piezo-MOS effect, the piezo-junction effect, the piezo-Hall effect and the piezo-tunnel effect, important electrical or electronic parameters of the integrated circuit arrangement are also affected by a mechanical stress acting on the integrated circuit arrangement. In the context of the further description, the changes to electrical or electronic parameters of the integrated circuit arrangement in the semiconductor material under the influence of a mechanical stress in the semiconductor material are referred to in general by the term "piezo effects".

A mechanical stress in the semiconductor material has the effect that the properties of the charge carriers related to the charge carrier transport, such as, for example, the mobility, collision time, scattering factor, Hall constant and so forth change. Expressed in general terms, the piezo-resistive effect indicates how the specific ohmic resistance of the respective semiconductor material behaves under the influence of a mechanical stress. Amongst other effects, changes to the characteristic curves of diodes and bipolar transistors result from the piezo-junction effect. The piezo-Hall effect describes the dependency of the Hall constant of the semiconductor material on the mechanical stress state in the semiconductor material. The piezo-tunnel effect occurs at reverse-biased, highly doped, flat lateral p-n junctions. This current is dominated by band-to-band tunnel effects, and is also stress-dependent. The piezo-resistive effect, and the "piezo-MOS effect", an expression sometimes found in the literature, can be classified as similar, since in the piezo-MOS effect, essentially just as in the piezo-resistive effect, the mobility of the charge carriers in the MOS channel of an MOS field effect transistor changes under the influence of the mechanical stress in the semiconductor material of the integrated circuit chip.

It therefore becomes clear that as a result of mechanical stresses in the semiconductor material of an integrated circuit arrangement, the electrical or electronic characteristics of the integrated circuit arrangement can be changed or impaired in an unpredictable manner. In many cases, a reduction in the performance (or parameters) of the integrated circuit arrangement, for example in the form of a degradation of the dynamic range, the resolution, the bandwidth, the current consumption or the accuracy and so forth can be observed.

In detail, the piezo-resistive effect referred to above indicates how the specific ohmic resistance of the respective semiconductor material behaves under the influence of a mechanical stress tensor and of the piezo-resistive coefficients. In integrated circuit arrangements (ICs), the respective current I, for example a control current, a reference current and so forth, is generated by circuit elements of the integrated circuit arrangement on the semiconductor chip. Essentially here, a defined voltage U is generated at an integrated resistor with the resistance value R, and the current I is coupled out. The current I can thus, in general, be generated at any resistive element, for example also at a MOS field effect transistor that is in the linear operating region. The voltage U can, for example, be generated using known bandgap principles in a way that is relatively constant with regard to mechanical stresses in the semiconductor material (apart from a comparatively small piezo-junction effect on the bandgap voltage that is generated). The resistance value R is, however, subject to the piezo-resistive effect. Because mechanical stresses in the semiconductor material caused by the package of the integrated circuit arrangement particularly act in a poorly controllable manner on the semiconductor circuit chip, the resistance value R for generating the current I, and therefore also the current I that is generated, changes in an unpredictable manner.

The piezo-Hall effect, on the other hand, now describes the dependence of the Hall constant on the mechanical stress state in the semiconductor material. Both the piezo-resistive effect and the piezo-Hall effect can be extremely disruptive in the operation of an integrated circuit arrangement, in particular a sensor arrangement such as, for example, an integrated Hall sensor, including the drive and evaluation electronics.

As a result of the piezo-Hall effect, which also occurs in the semiconductor material of the semiconductor chip of the integrated circuit arrangement as a result of mechanical stresses, then in the case of a Hall sensor arrangement, the current-dependent sensitivity $S_{i,Hall}$ of the Hall sensor changes. On top of this, as a result of the piezo-resistive effect, the Hall supply current through the Hall sensor changes when mechanical stresses are present in the semiconductor material of the Hall sensor arrangement, since the Hall supply current (control current) is, for example, only defined by a resistor $R_{Hall}$, also integrated, over which a voltage U is made to drop, possibly using a control loop. A change in the Hall supply current resulting from a resistance change $\delta R_{Hall}$ due to the piezo-resistive effect therefore leads to a change in the sensitivity $S_{i,Hall}$ of the Hall sensor.

The magnetic sensitivity of the Hall sensor $S_{i,Hall}$ can (as indicated above) be defined as the ratio between the output voltage $U_{Hall}$ of the Hall sensor to the magnetic field component B acting on it. A mechanical stress in the semiconductor material of the Hall sensor arrangement thereby affects the current-dependent magnetic sensitivity $S_{i,Hall}$ of a Hall sensor. In general, an attempt is made to keep the magnetic sensitivity $S_{i,Hall}$ of a Hall sensor as constant as possible, where influences resulting in particular from mechanical stresses are disturbing due to the piezo-resistive effects and piezo-Hall effects described above.

In terms of integrated Hall sensor circuit arrangements that generate a switching signal that depends on the magnetic field component B acting on them, it is to be noted that the magnetic switching threshold $B_S$ can always be traced back to the following formula:

$$B_S \sim R_{Hall}/S_{i,Hall}.$$

In general it can therefore be the that the ratio of the current-dependent magnetic sensitivity $S_{i,Hall}$ to a resistance value $R_{Hall}$ is determinative for the magnetic parameters such as, for example, the sensitivity or the switching thresholds of a Hall sensor arrangement.

Mechanical stresses in the semiconductor material of an integrated circuit arrangement can thus ultimately have a detrimental effect on the magnetic sensitivity or the switching thresholds of an overall system built on a Hall sensor arrangement. In practice, magnetic switching sensors can have switching thresholds prior to the packaging process (e.g. at the wafer stage) that differ by about 10% from those switching thresholds after being mounted in a package. The piezo effects referred to above are the cause of this. Thus, in particular after being mounted in a package, a curve of the "magnetic switching thresholds against temperature" in the form of a hysteresis loop, opening between 1% and 4%, can be found, and this is in particular to be observed if the IC package has absorbed a large amount of moisture before or during the packaging process, and the dwell time of the semiconductor circuit chip at temperatures above 100° C. is more than about 10 minutes (which is typically the diffusion time constant of small packages for integrated circuits). The piezo effects referred to above are again the cause of this.

It should be noted in relation to the piezo effects presented above, that the coefficients that define the mechanical stresses that occur in the semiconductor material are "tensors", e.g. that the current-dependent magnetic sensitivity $S_{i,Hall}$ of a Hall element, and the resistance value R of a resistive element, are changed not only by the amplitude of the mechanical stress in the semiconductor material, but also by the direction of the stress in the semiconductor material. The directional dependency of the mechanical stress in the semiconductor material applies to the {100}-silicon material used most often for p-doped and n-doped resistors Rp, Rn. It should further be noted that for reasons of symmetry {100}-wafers and {001}-wafers correspond to one another in cubic crystals.

The way in which attempts have previously been made to reduce the disturbing piezo influences described above will now briefly be described below. In the case, for example, of {100}-silicon material, the dependency of integrated resistors on mechanical stresses can be reduced in that p-doped resistors are used instead of n-doped resistors wherever possible, since p-doped integrated resistors generally have smaller piezo-coefficients.

Two resistors of nominally equal size can, furthermore, be laid out close to and perpendicular to one another, and connected electrically in series or in parallel (known as an L-layout). As a result, the total resistance becomes as independent as possible of the direction of the mechanical stress in the semiconductor material, and is thereby as reproducible as possible. At the same time, the piezo-sensitivity of such an arrangement also becomes as small as possible for arbitrary directions of the mechanical stress.

In addition to this, an effort is being made to design the IC package in such a way that the mechanical stress on the semiconductor circuit chip is more effectively reproducible. It is either possible for this purpose to use more expensive ceramic packages, or for the mechanical parameters of the package components, e.g. the semiconductor circuit chip, the lead frame, the potting compound, adhesive material or soldering material to be matched to one another in such a way that the influences of the various package components compensate for one another as far as possible, or are at least as constant as possible in terms of the assembly batch and stress loading of the integrated circuit arrangement when in operation. It should, however, be clear that matching the mechanical parameters of the package components is extremely laborious, and furthermore that very small changes to the process flow again lead to a change of the influences of the various package components.

It is clear from the above explanations that hard-to-manage influence on the physical functional parameters of semiconductor components of integrated circuit arrangements on a semiconductor circuit chip resulting from mechanical stresses in the semiconductor material can be caused by various piezo effects. Compensating for the influence of the piezo effects on the physical and electronic functional parameters of the semiconductor components is here problematic in that the stress components that occur in the semiconductor material are generally not known in advance, nor do they remain constant during the service life, so that, in order to be able to appropriately control the piezo-influences referred to above on the semiconductor material and thereby on the electronic and physical functional parameters of the semiconductor components, the mechanical parameters when housing the integrated circuit arrangement in a package, e.g. for example the material of the semiconductor chip, the lead frame, the potting compound, the adhesive or the solder material can only be matched to one another with great difficulty if at all.

Devices and methods described herein may provide improved concepts for the compensation of piezo-influences on integrated circuit arrangements.

A semiconductor circuit arrangement is proposed according to one aspect. The semiconductor circuit arrangement comprises a semiconductor substrate. A Hall sensor circuit is integrated into the semiconductor substrate. The Hall sensor circuit comprises a first terminal and a second terminal positioned opposite the first terminal. The Hall sensor circuit further comprises a third terminal and a fourth terminal positioned opposite the third terminal. The Hall sensor circuit is configured to guide a Hall supply current between the first terminal and the opposite, second terminal at a first angle to a normal to a primary flat plane of the semiconductor substrate, laterally through a Hall effect region during a first clock phase. A first electrical voltage signal is thereby generated in the Hall effect region. Both the Hall supply current and the first electrical voltage signal have a first dependency on a mechanical stress of the semiconductor substrate. The Hall sensor circuit is also configured to guide a Hall supply current between the third terminal and the opposite, fourth terminal at a second angle that is orthogonal to the first angle, laterally through the Hall effect region during a second clock phase. A second electrical voltage signal is thereby generated in the Hall effect region. Both the Hall supply current and the second electrical voltage signal have a second dependency on a mechanical stress of the semiconductor substrate. According to the subject matter described herein, the semiconductor circuit arrangement is furthermore configured to ascertain a specific mechanical stress component (for example a shear stress and/or a normal stress). The ascertainment of the mechanical stress components takes place based on a combination of the first electrical voltage signal and of the second electrical voltage signal.

According to a further aspect, a method for ascertaining a mechanical stress component using a semiconductor circuit arrangement with a semiconductor substrate and a Hall sensor circuit integrated therein is proposed, wherein the Hall sensor circuit comprises a first terminal and a second terminal positioned opposite the first terminal, as well as a third terminal and a fourth terminal positioned opposite the third terminal. The method comprises a step in which, during a first clock phase, a Hall supply current is applied, this being done between the first terminal and the opposite, second terminal in order to guide the Hall supply current at a first angle to a normal to a primary flat plane of the semiconductor substrate, laterally through a Hall effect region of the Hall sensor circuit, wherein the Hall supply current generates a first electrical voltage signal in the Hall effect region, wherein the first electrical voltage signal has a first dependency on a mechanical stress of the semiconductor substrate. The method further comprises a further step in which, during a second clock phase, a Hall supply current is applied between the third terminal and the opposite, fourth terminal in order to guide the Hall supply current at a second angle that is orthogonal to the first angle, laterally through the Hall effect region of the Hall sensor circuit, wherein the Hall supply current generates a second electrical voltage signal in the Hall effect region, and wherein the second electrical voltage signal has a second dependency on a mechanical stress of the semiconductor substrate. The method further comprises a step in which a specific mechanical stress component is ascertained, this being done based on a combination of the first electrical voltage signal and of the second electrical voltage signal.

BRIEF DESCRIPTION OF THE DRAWINGS

Some example implementations are illustrated, by way of example, in the drawing and are explained below. Here:

FIG. 9 shows a schematic view to illustrate a method according to one example implementation.

DETAILED DESCRIPTION

Example implementations are described with reference to the figures in more detail below, wherein elements with the same or similar functions are given the same reference signs.

Method steps that are illustrated in one block diagram and explained in that context can also be carried out in a sequence other than that illustrated or described. In addition, method steps that relate to a specific feature of a device can be exchanged with this very feature of the device, and the opposite is equally true.

Integrated Hall sensor circuits are treated below. This can in particular involve lateral Hall plates. The term "lateral" is to be understood here in the sense of "parallel to the chip surface". The lateral Hall plates can also be referred to as horizontal Hall plates or planar Hall plates.

A semiconductor substrate with an integrated Hall sensor circuit is described in example implementations. This integrated Hall sensor circuit can comprise a first terminal and a second terminal positioned opposite the first terminal, as well as additionally a third terminal and a fourth terminal positioned opposite the third terminal. In some example implementations, the integrated Hall sensor circuit can comprise precisely or exclusively these four terminals just mentioned. In further example implementations, in precisely four spinning phases, all the stresses for calculation of the stress components $s_{xx}+s_{yy}$, $s_{xx}-s_{yy}$ and $s_{xy}$ and a Hall voltage are ascertained, and each individual component obtained by forming the sum and/or difference of at least two spinning phases.

In order to simplify the understanding of the following detailed description of a semiconductor circuit arrangement for compensating various piezo effects, the definitions used below relating to the semiconductor material used and the specified directions on the same crystal alignment of the semiconductor material are now first illustrated based on FIGS. 1A to 1C.

To manufacture integrated circuits, the semiconductor wafers such as, for example, silicon wafers or silicon disks, are sawn off a monocrystalline bar in such a way that the wafer surface is associated with one crystallographic plane. What are known as the "Miller indices" are used in order to specify the respective plane in a cubic crystal. FIG. 1A shows, for example, a plan view of a semiconductor wafer that is cut in the (100) plane.

Figure 1A:
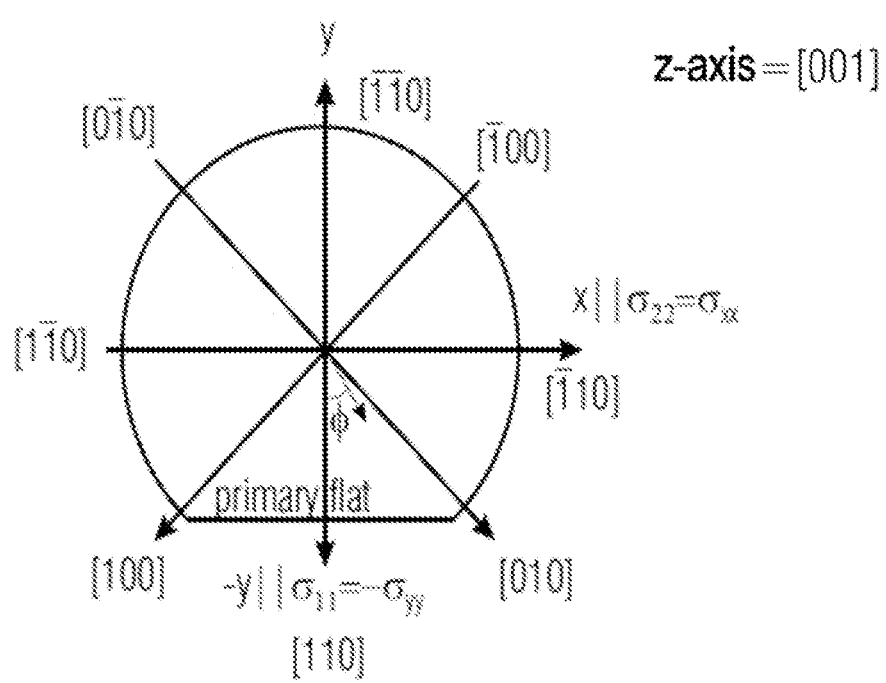
FIGS. 1A-1C show general definitions of crystallographic directions in the plane (wafer plane) of a semiconductor material.
Figure 1B:
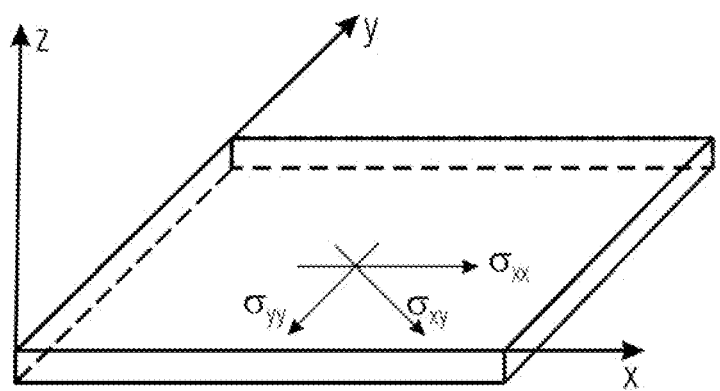
Figure 1C:
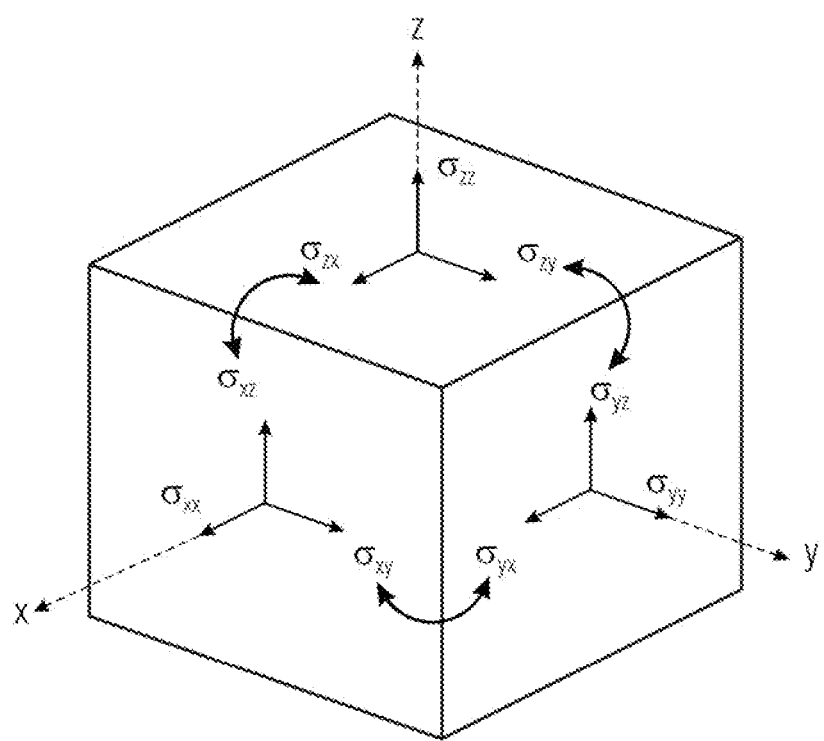

In FIGS. 1A to 1C the primary crystallographic directions are furthermore indicated in the wafer plane, wherein the manufacturers of silicon wafers often provide what is known as a "primary flat" at the silicon disk. Notches or the like can equally well be used for identification. Notches of this type should thus be understood as equivalent to a primary flat in the context of this disclosure. The edges of the rectangular geometries of the circuit structures on the semiconductor chip usually run parallel to or perpendicular to the primary flats. In particular, in FIG. 1A the crystallographic directions or axes in the plane of the semiconductor wafer are illustrated, wherein these are represented below in square brackets. The coordinate system is usually used in such a way that the [110] direction extends perpendicular to, or normal to, the primary flat, while the [1̄10] direction extends parallel to the primary flat. The directions [010] and [100] extend at an angle of ±45° to the [110] direction, which defines a normal to the primary flat plane. The directions [01̄0] and [1̄00] extend at an angle of ±45° to the [1̄1̄0] direction, that also defines a normal (in the direction opposite to [110]) to the primary flat plane.

An angle Φ with respect to the [110] direction is also defined, wherein the angle Φ is counted counterclockwise in a plan view on the top face of the wafer, starting from the [110] direction. The individual chips are usually positioned on the wafer in such a way that the directions Φ=0° and Φ=90° correspond to the vertical and horizontal directions respectively of the IC, wherein these directions can be interchanged, depending on whether the IC is positioned upright or lying down. In what follows, furthermore, the direction Φ=90° is referred to as the x-axis [1̄10] direction, and the direction Φ=0° as the negative y-axis ([110] direction).

On the assumption that the x-axis is identical to the crystal direction [1̄10], and the y-axis is identical to the [1̄1̄0] crystal direction, this in particular means that the semiconductor circuit chip is manufactured from a {100} semiconductor material ({100} silicon, for example). The primary flat is then usually parallel to the x-axis, so that the edges of the semiconductor circuit chip are parallel to the x-axis and the y-axis. The crystal directions [100] and [010] are then identical to the diagonals of the semiconductor circuit chip (cf. FIG. 1B).

Since a {100} silicon material is used in the majority of applications for integrated semiconductor circuit arrangements, the following explanations refer, for the sake of simplifying the explanations, and due to their particular practical significance, above all to the numerical values for {100} silicon material that are relevant for this material. It should, however, be obvious to the person skilled in the art that other semiconductor materials, or other silicon materials, can accordingly also be used.

This mechanical stress is a tensor magnitude, and refers to the force per unit area that acts within a rigid body under the influence of a mechanical load. This force can be represented by cutting the rigid body. This force must theoretically be applied to the cut planes for the body to receive the same load.

FIG. 1C shows a small block that has been cut out of a rigid body. As can be seen, such a cut through the body can have various orientations, which in turn influences the forces at the cut surfaces. This means that the force (which is a vector) also depends on the orientation of the cut. This force (e.g. the mechanical stress) accordingly also has more than three degrees of freedom. The illustrated block has cut surfaces that are respectively parallel to the x, y and z axes. The forces at each of the cut surfaces can be decomposed into individual components, each of which point in the x, y and z directions. At each cut surface there is a component that is perpendicular to the surface: this is the normal stress component $\sigma_{XX}$. Two adjacent components are found at each cut surface, extending parallel to the surface: these are the shear stress components $\sigma_{XY}$, $\sigma_{XZ}$. The first index identifies the direction of the surface, and the second index identifies the direction of the force.

The normal stress can be a compressive stress or a tensile stress, depending on the arithmetic sign. Normal stresses act perpendicularly to the coordinate surface, meaning that the normal direction and the direction of action are the same. The shear stress acts tangentially to the surface, and represents a shear loading.

There are altogether nine components, there being three cut surfaces, each of which has a normal stress component and two shear stress components. The forces at the opposite regions (e.g. the negative planes with normal vectors in the negative x, y and z directions) are of the same magnitude, but have negative arithmetic signs. If the forces, or the moment equilibria, are applied to the block illustrated in FIG. 1C, it can be seen that the shear stresses are equal when their indices are interchanged: $\sigma_{YZ}=\sigma_{ZY}$, $\sigma_{XZ}=\sigma_{ZX}$, $\sigma_{XY}=\sigma_{YX}$. Finally, we thus finish with six independent components of the stress tensor, e.g. three normal stress components, $\sigma_{XX}$, $\sigma_{YY}$, $\sigma_{ZZ}$ and three shear stress components $\sigma_{YZ}$, $\sigma_{XZ}$, $\sigma_{XY}$.

Usually not all six stress components have to be considered at the same time, since in the case of microelectronic packages what are known as laminates are usually used, whose lateral extension in the x, y directions is significantly larger than its thickness in the z direction (see also FIG. 1B).

Figure 2:
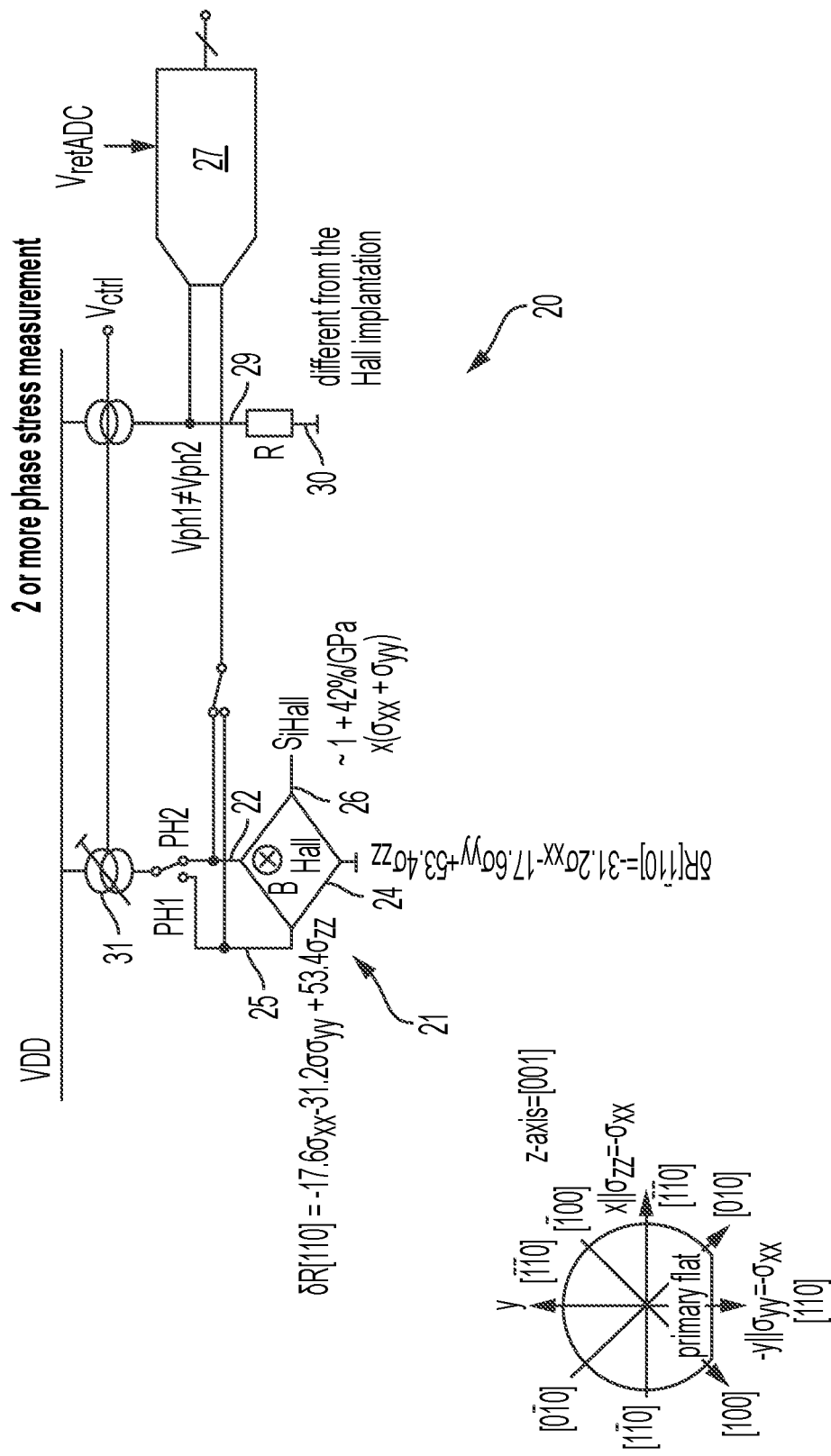
FIG. 2 shows a schematic illustration of a semiconductor circuit arrangement for compensating a mechanical stress of a Hall sensor circuit integrated into a semiconductor substrate.

A semiconductor circuit arrangement 20 for the compensation of a mechanical stress of a Hall sensor circuit integrated into a semiconductor substrate will now be described in the following with reference to FIG. 2. This schematically illustrated semiconductor circuit arrangement 20 comprises a Hall sensor circuit 21 integrated into the semiconductor substrate. The Hall sensor circuit 21 is configured to guide a Hall supply current between a first terminal 22 and a second terminal 23 of a Hall effect region or Hall plate 24 at a 90° angle to a normal to a primary flat plane of the semiconductor substrate laterally through the Hall effect region 24 (for example thus in the [$\bar{1}$10] direction) during a first clock interval PH1. During the first clock interval PH1 a first voltage Vph1 is, for example, measured at the first terminal 22 of the Hall effect region 24, and digitized by an analog-to-digital converter (ADC) 27. For the [$\bar{1}$10] direction shown here by way of example as the first current direction, a stress-direction-dependent change in resistance of $$\delta R[\bar{1}10] = -31.2\, \delta_{xx} - 17.68\, \delta_{yy} + 53.4\, \delta_{zz}$$

results by way of example for n-diffusion resistors from mechanical stress.

This means that in the case of a current direction in the [$\bar{1}$10] direction, the total resistance undergoes a change of −31.2% per GPa caused by the mechanical normal stress component $\sigma_{XX}$ and a change of −17.6% per GPa caused by the mechanical normal stress component $\sigma_{YY}$, and a change of +53.4% per GPa caused by the mechanical normal stress component $\sigma_{ZZ}$.

The Hall sensor circuit 21 is configured to guide the Hall supply current between a third terminal 25 and a fourth terminal 26 of the Hall effect region 24 at a 0° angle to the normal to the primary flat plane of the semiconductor substrate laterally through the Hall effect region 24 (thus for example in the [110] direction) during a second clock interval PH2. During the second clock interval PH2 a second Hall voltage Vph2 is, for example, measured at the first terminal 22 of the Hall effect region 24, and digitized by the ADC 27. For the [110] direction shown here by way of example as the second current direction, a stress-direction-dependent change in resistance of $$\delta R[110] = -17.6\, \delta_{xx} - 31.2\, \delta_{yy} + 53.4\, \delta_{zz}$$

results by way of example for n-diffusion resistors from mechanical stress.

Figure 3:
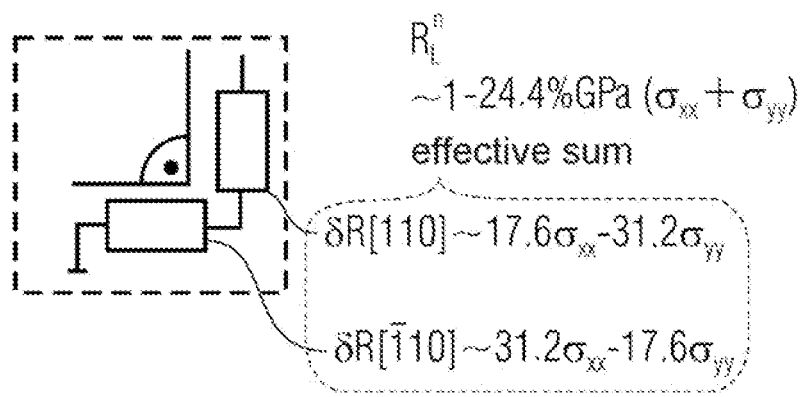
FIG. 3 shows an L-resistor arrangement.

The current directions of the two clock phases PH1 and PH2 can, of course, also be interchanged. With the semiconductor circuit arrangement 20 the directional dependency of piezo-resistive effects can be eliminated in that current flows through the Hall effect region 24 during the first clock interval PH1 at an angle of 90° (or an angle of 0°) to the normal to the primary flat plane and flows in a direction orthogonal to that during the second clock interval PH2, and wherein a time average of the two clock intervals can be made. As a result of the two averaged clock intervals, the Hall effect region 24 behaves like two laterally orthogonal resistors in what is known as the L layout (see FIG. 3) which behaves independently with respect to mechanical stress compared to a rotation of the whole arrangement through ±45°. In an example {100} silicon semiconductor material, the piezo-resistive coefficients $\pi_{11}$ and $\pi_{12}$, along with the normal stress components $\sigma_{XX}$ and $\sigma_{YY}$ in the plane of the chip surface, are above all relevant for the piezo-resistive effect. For n-doped resistors in a lateral L layout according to FIG. 3, the equation that applies is: $\delta R''_L = -24.4\%/\mathrm{GPa}\,(\sigma_{XX}, \sigma_{YY})$. This means that the total resistance undergoes a change of −24.4% per GPa under the influence of the normal stress components $\sigma_{XX}$, $\sigma_{YY}$. The change in the resistance can in this case thus be essentially or exclusively dependent on the two normal stress components $\sigma_{XX}$, $\sigma_{YY}$.

As just explained, with the semiconductor circuit arrangement 20 illustrated here, the directional dependency of piezo-resistive effects can be eliminated in that current flows through the Hall effect region 24 during the first clock interval PH1 at an angle of 90° (or an angle of 0°) to the normal to the primary flat plane and flows in a direction orthogonal to that during the second clock interval PH2, wherein a time average of the two clock intervals can be made.

It is recognized in accordance with the concept described here, that the stress components ascertained using the Hall sensor circuit can not only be used to compensate for negative effects on the Hall sensor circuit caused by stress, but also to compensate for negative effects on other components and/or circuits, e.g. that are separate from the Hall sensor circuit, caused by stress, in particular in the case in which these separate components and/or circuits are integrated onto the same semiconductor substrate as the Hall sensor circuit.

Figure 4A:
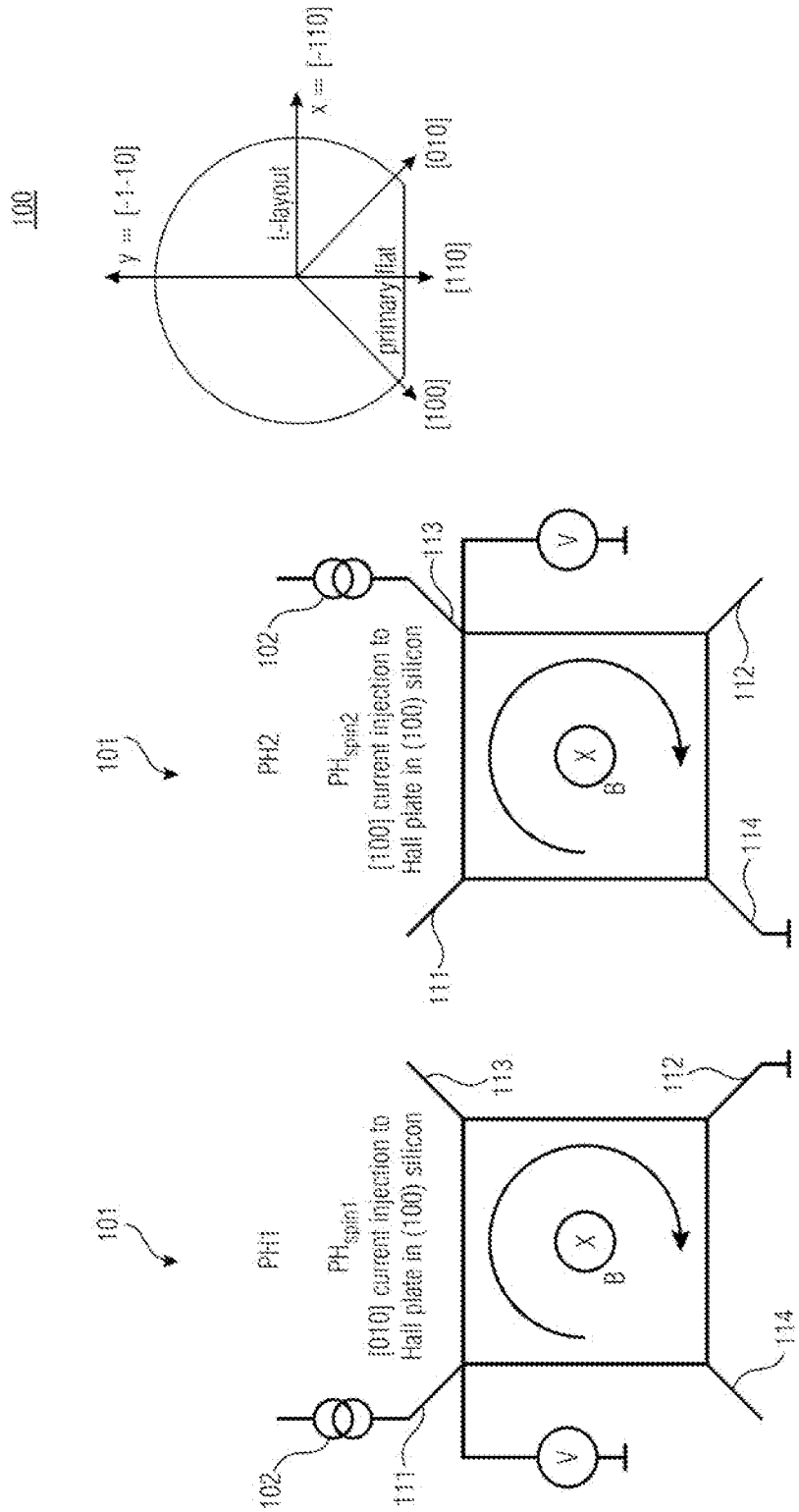
FIGS. 4A-4B show a schematic overview of a circuit diagram to illustrate the semiconductor circuit arrangement with the integrated Hall sensor circuit according to one example implementation.
Figure 4B:
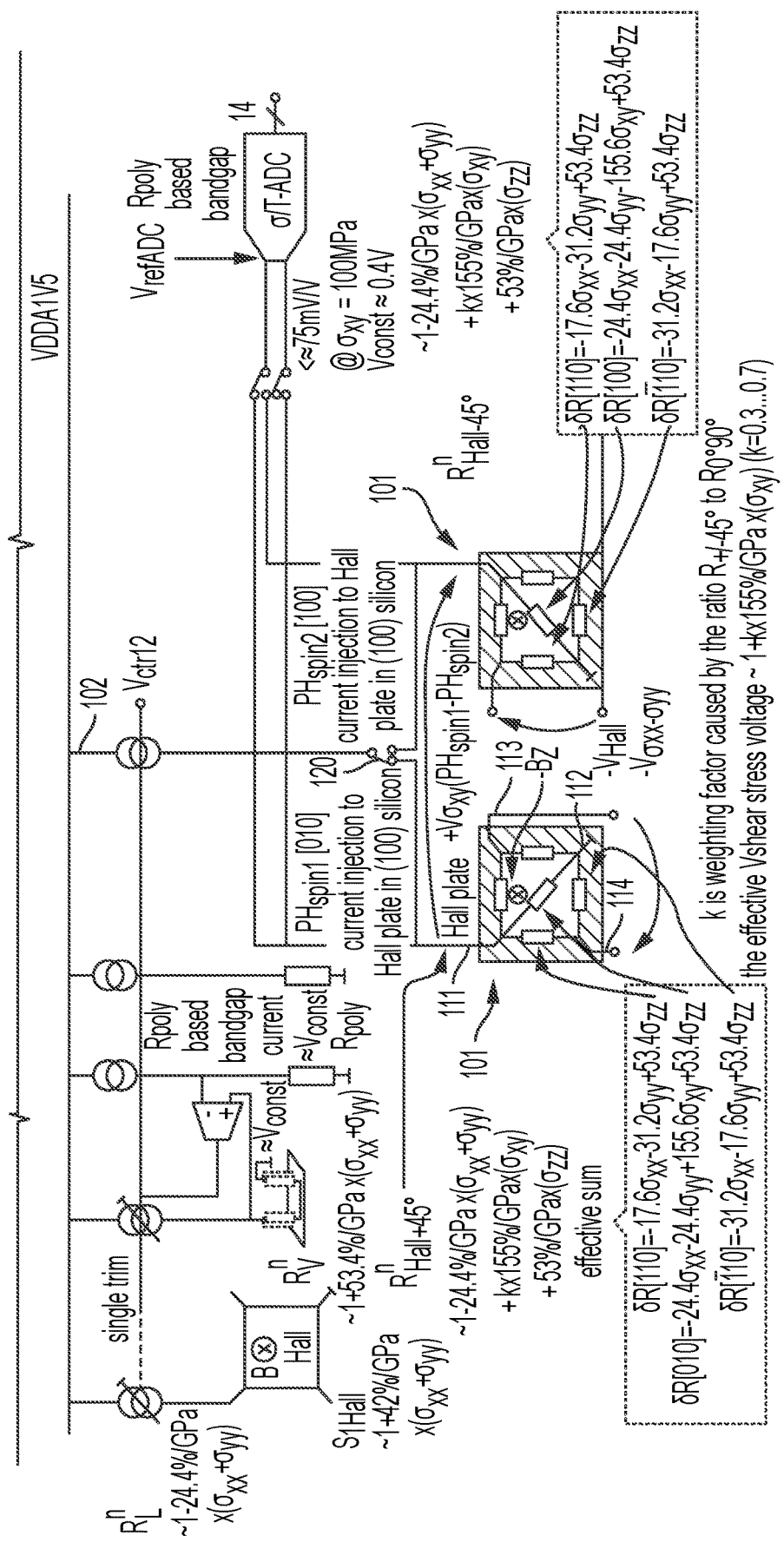

FIGS. 4A and 4B show a device for ascertaining mechanical stress components. The device can be a semiconductor circuit arrangement 100 with a semiconductor substrate, wherein the semiconductor substrate comprises an integrated Hall sensor circuit 101. The semiconductor substrate can, for example, be a {100} silicon substrate. It should be explained that here we only have a purely schematic illustration of the Hall sensor circuit 101 in a first clock phase PH1 or PH$_{spin1}$ and a second clock phase PH2 or PH$_{spin2}$. This means that although two Hall sensor circuits 101 are shown here, these are in fact one and the same Hall sensor circuit that is simply illustrated once in the first clock phase PH1 and once in the second clock phase PH2.

An enlarged illustration of the Hall sensor circuit 101 in the two clock phases PH1 and PH2 is shown to the top left of the image in FIGS. 4A and 4B. On the left-hand side, e.g. in the first clock phase PH1, a Hall supply current 102 is guided between a first terminal 111 and a second terminal 112 laterally through the Hall sensor circuit 101. In the case of the {100} silicon described here purely by way of example, the Hall supply current 102 flows in the [010] direction through the Hall sensor circuit 101. On the right-hand side, e.g. in the second clock phase PH2, a Hall supply current 102 is guided between a third terminal 113 and a fourth terminal 114 laterally through the Hall sensor circuit 101. In the case of the {100} silicon described here purely by way of example, the Hall supply current 102 flows in the [100] direction through the Hall sensor circuit 101. The term "lateral" is to be understood here in the sense of "parallel to the chip surface".

We refer now to the two illustrated Hall sensor circuits 101 that are drawn in FIGS. 4A and 4B in the lower part of the circuit. Here again, the Hall sensor circuit 101 on the left is shown in a first clock phase PH1, and the Hall sensor circuit 101 on the right is shown in a second clock phase PH2. A switch 120 is drawn here purely schematically in order to symbolize the switching between the two clock phases PH1, PH2.

It can additionally be seen that in a first clock phase PH1, the Hall supply current 102 is guided between the first terminal 111 and the second terminal 112 positioned (here diagonally) opposite the Hall effect region at a 45° angle to a normal to the primary flat plane, drawn above to the right, of the semiconductor substrate, laterally through the Hall effect region. As can also be seen from the diagram shown in FIG. 1A, for an example {100} silicon semiconductor material such 45° angles correspond to the directions [100], [010], [$\bar{1}$00] or [0$\bar{1}$0]. The Hall effect region, and thereby the Hall supply current 102 here have a first dependency on a mechanical stress of the semiconductor substrate.

The resistor arranged on the left to the outside in the Hall effect region, e.g. the resistor that extends in the [110] direction, exhibits a resistance change of:

$$\delta R[110] = -17.6\ \sigma_{xx} - 31.2\ \sigma_{yy} + 53.4\ \sigma_{zz}$$

The resistor arranged at the bottom in the Hall effect region, e.g. the resistor that extends in the [$\bar{1}$10] direction, exhibits a resistance change of:

$$\delta R[\bar{1}10] = -31.2\ \sigma_{xx} - 17.6\ \sigma_{yy} + 53.4\ \sigma_{zz}$$

The resistor arranged diagonally in the Hall effect region, e.g. the resistor that extends in the [010] direction, exhibits a resistance change of:

$$\delta R[010] = -24.4\ \sigma_{xx} 24.4\ \sigma_{yy} + 155.6\ \sigma_{xy} + 53.4\ \sigma_{zz}$$

It can thus be seen that the diagonal resistor, e.g. the resistor extending in the [010] direction has the respective mean value of the normal stress components $\sigma_{xx}$, $\sigma_{yy}$, and $\sigma_{zz}$ of the left-hand resistor and of the bottom resistor, plus an additional shear stress component $\sigma_{xy}$ in the diagonal direction, e.g. in the [010] direction.

The same applies to the second clock phase PH2, wherein here the arithmetic sign of the additional shear stress component $\sigma_{xy}$ is reversed in the diagonal direction. From this it follows that the diagonal resistance here is rotated in comparison with the first clock phase PH1 through 90°, so that the Hall supply current runs in the opposite direction, e.g. in the [100] direction.

For the first clock phase PH1, during which the Hall supply current flows in the [010] direction (which is specified here by definition as +45°) the following effective sum thus results for the total resistance change:

$$R''_{Hall+45°} \sim 1 - 24.4\%/\text{GPa} \times (\sigma_{xx} + \sigma_{yy}) + k \times 155\%/\text{GPa} \times (\sigma_{xy}) + 53\%/\text{GPa} \times (\sigma_{zz})$$

or, for the second clock phase PH2, with a negative arithmetic sign:

$$R''_{Hall-45°} \sim 1 - 24.4\%/\text{GPa} \times (\sigma_{xx} + \sigma_{yy}) - k \times 155\%/\text{GPa} \times (\sigma_{xy}) + 53\%/\text{GPa} \times (\sigma_{zz})$$

The factor k is a weighting factor resulting from the proportional contributions of resistance components that are vertical and horizontal to the diagonal in the Hall plate model.

Figure 5A:
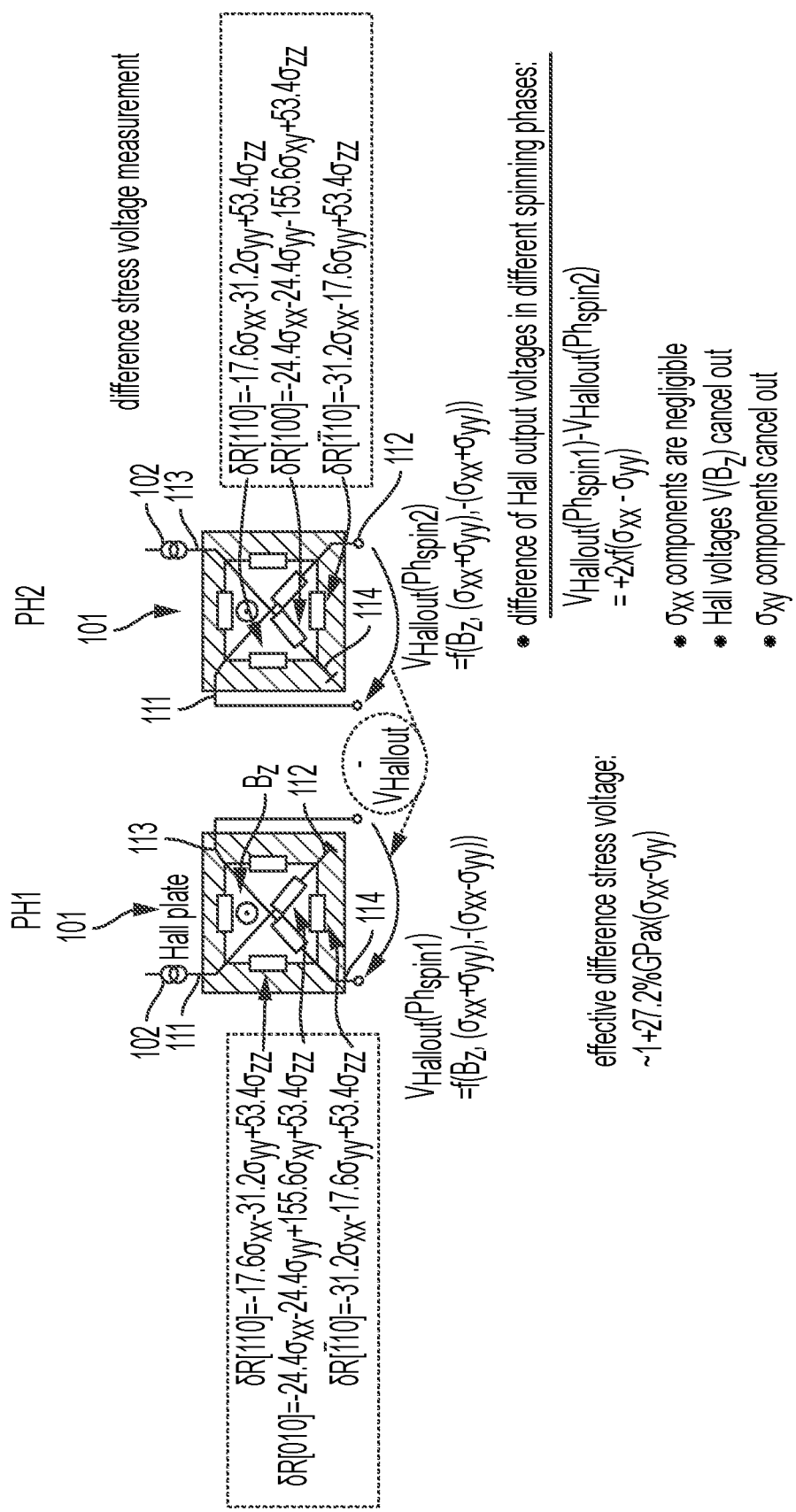
FIGS. 5A-5B show a schematic view of two example implementations of Hall sensor circuits that are configured to ascertain a difference stress.
Figure 5B:
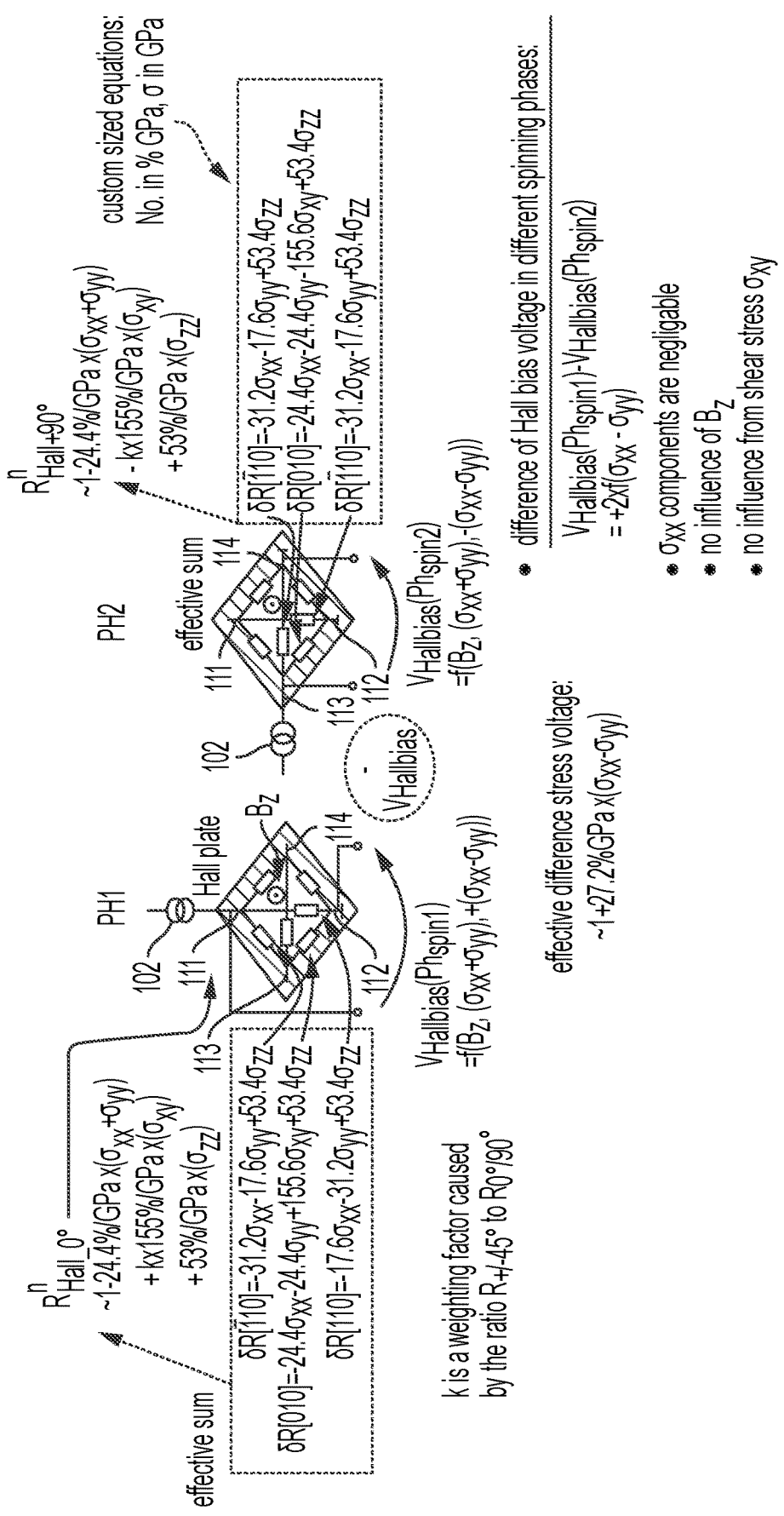

This Hall sensor circuit 101 is also illustrated again in FIG. 5A. FIG. 5B on the other hand shows a semiconductor circuit arrangement with a Hall sensor circuit 101, or a horizontal Hall plate 101, that is rotated through 45° with respect to the horizontal Hall plate 101 shown in FIG. 5A.

In FIG. 5A the Hall supply current 102 is guided laterally through the Hall effect region during a first clock phase PH1 in a direction at +45° with respect to a normal to the primary flat plane, e.g., in the case of a {100} silicon substrate in the [010] direction. In a second clock phase PH2, the Hall supply current 102 is then guided laterally through the Hall effect region in a direction at −45° with respect to a normal to the primary flat plane, e.g., in the case of a {100} silicon substrate in the [100] direction.

FIG. 5B shows a Hall sensor circuit 101, or a horizontal Hall plate 101, that is rotated through 45° with respect to the horizontal Hall plate 101 shown in FIG. 5A. In FIG. 6B the Hall supply current 102 is guided laterally through the Hall effect region during a first clock phase PH1 in a direction at 0° with respect to a normal to the primary flat plane, e.g., in the case of a {100} silicon substrate in the [110] direction. In a second clock phase PH2, the Hall supply current 102 is then guided laterally through the Hall effect region in a direction at 90° with respect to a normal to the primary flat plane, e.g., in the case of a {100} silicon substrate in the [$\bar{1}$10] direction.

The flow of the Hall supply current 102 generates an electrical voltage in the Hall effect region of the integrated Hall sensor circuit 101. This electrical voltage can be accessed in the form of an electrical voltage signal at, for example, two of the total of four terminals 111, 112, 113, 114. An electrical voltage signal in the form of a Hall output voltage $V_{Hallout}$ can, for example, be accessed at the two terminals at which the Hall supply current 102 is not fed in. On the other hand, an electrical voltage signal in the form of a Hall bias voltage $V_{Hallbias}$ can be accessed at the terminals at which the Hall supply current 102 is fed in.

A first voltage signal $V_{Hallout}(\text{PH}_{spin1})$ or $V_{Hallbias}(\text{PH}_{spin1})$ can accordingly be accessed in the first clock phase PH1, and a second voltage signal $V_{Hallout}(\text{PH}_{spin2})$ or $V_{Hallbias}(\text{PH}_{spin2})$ can accordingly be accessed in the second clock phase PH2. The first voltage signal $V_{Hallout}(\text{PH}_{spin1})$ or $V_{Hallbias}(\text{PH}_{spin1})$ has a first dependency on a mechanical stress of the semiconductor substrate, and the second voltage signal $V_{Hallout}(\text{PH}_{spin2})$ or $V_{Hallbias}(\text{PH}_{spin2})$ has a different, second dependency on a mechanical stress of the semiconductor substrate.

Expressed more generally, the Hall sensor circuit 101 according to the subject matter described herein, is configured in order, during a first clock phase $\text{PH}_{spin1}$ to guide a Hall supply current 102 between the first terminal 111 and the opposite, second terminal 112 at a first angle $\Phi_1$ ( to a normal to a primary flat plane of the semiconductor substrate, laterally through a Hall effect region, and to generate a first electrical voltage signal $V_{Hallout}(\text{PH}_{spin1})$ or $V_{Hallbias}(\text{PH}_{spin1})$ in the Hall effect region, wherein the first electrical voltage signal $V_{Hallout}(\text{PH}_{spin1})$ or $V_{Hallbias}(\text{PH}_{spin1})$ has a first dependency on a mechanical stress of the semiconductor substrate. In the case of FIG. 5A, the first angle is $\Phi_1 = +45°$, and in the case of FIG. 5B the first angle is $\Phi_1 = 0°$.

The Hall sensor circuit 101 is furthermore configured to guide a Hall supply current 102 between the third terminal 113 and the opposite, fourth terminal 114 at a second angle $\Phi_2$ that is orthogonal to the first angle $\Phi_1$, laterally through the Hall effect region during a second clock phase $\text{PH}_{spin2}$, and to generate a second electrical voltage signal $V_{Hallout}(\text{PH}_{spin2})$ or $V_{Hallbias}(\text{PH}_{spin2})$ in the Hall effect region, wherein the second electrical voltage signal $V_{Hallout}(\text{PH}_{spin2})$ or $V_{Hallbias}(\text{PH}_{spin2})$ has a second dependency on a mechanical stress of the semiconductor substrate. In the case of FIG. 5A, the second angle is $\Phi_2 = -45°$, and in the case of FIG. 5B the second angle is $\Phi_2 = 90°$.

According to the concept described herein the semiconductor circuit arrangement 100 is furthermore configured to ascertain a specific mechanical stress component, for example a normal stress component and/or a shear stress component, and to do so based on a combination of the first electrical voltage signal $V_{Hallout}(\text{PH}_{spin1})$ or $V_{Hallbias}(\text{PH}_{spin1})$ and of the second electrical voltage signal $V_{Hallout}(\text{PH}_{spin2})$ or $V_{Hallbias}(\text{PH}_{spin2})$.

This will be explained below in more detail with reference to the FIGS. 5A and 5B. In FIG. 5A a Hall output voltage $V_{Hallout}(\text{PH}_{spin1})$ or $V_{Hallout}(\text{PH}_{spin2})$ is accessed during both the first clock phase PH1 and the second clock phase PH2 at whichever terminals the Hall supply current 102 is not being fed in. This means that a first electrical voltage signal is accessed in the form of a first Hall output voltage $V_{Hallout}(\text{PH}_{spin1})$ at the third and fourth terminals 113, 114 during the first clock phase PH1, and a second electrical voltage signal in the form of a second Hall output voltage $V_{Hallout}(PH_{spin2})$ is accessed at the first and second terminals 111, 112 during the second clock phase PH2.

The first electrical voltage signal $V_{Hallout}(PH_{spin1})$ accessed during the first clock phase PH1 depends on the magnetic field component $B_z$ as well as on what is known as the aggregate mechanical stress, e.g. on the sum of the normal stress components in the x and y directions ($\sigma_{xx}+\sigma_{yy}$), and on what is known as the difference mechanical stress, e.g. on the difference between the normal stress components in the x and y directions ($\sigma_{xx}-\sigma_{yy}$). The first electrical voltage signal $V_{Hallout}(PH_{spin1})$ is, however, independent of a shear stress component. The dependency on the normal stress component in the z direction $\sigma_{zz}$ is also negligible. The difference stress ($\sigma_{xx}-\sigma_{yy}$) here has a negative arithmetic sign during the first clock phase PH1, which means:

$$V_{Hallout}(PH_{spin1})=f(B_z, (\sigma_{xx}+\sigma_{yy}), -(\sigma_{xx}-\sigma_{yy})).$$

The first voltage signal $V_{Hallout}(PH_{spin1})$ thus accordingly has a first dependency on a mechanical stress of the semiconductor substrate.

The second electrical voltage signal $V_{Hallout}(PH_{spin2})$ accessed during the second clock phase PH2 also depends on the magnetic field component $B_z$ as well as on the aggregate mechanical stress, e.g. on the sum of the normal stress components in the x and y directions ($\sigma_{xx}+\sigma_{yy}$), and on the difference mechanical stress, e.g. on the difference between the normal stress components in the x and y directions ($\sigma_{xx}-\sigma_{yy}$). The second electrical voltage signal $V_{Hallout}(PH_{spin2})$ is also independent of a shear stress component, while the dependency on the normal stress component in the z direction $\sigma_{zz}$ is also negligible. The mechanical difference stress ($\sigma_{xx}-\sigma_{yy}$) here however has a positive arithmetic sign during the second clock phase PH2, meaning that:

$$V_{Hallout}(PH_{spin2})=f(B_z, (\sigma_{xx}+\sigma_{yy}), +(\sigma_{xx}-\sigma_{yy})).$$

The second voltage signal $V_{Hallout}(PH_{spin2})$ thus accordingly has a second dependency on a mechanical stress of the semiconductor substrate.

According to the example implementation shown here in FIG. 5A, the combination of the two electrical voltage signals $V_{Hallout}(PH_{spin1})$ and $V_{Hallout}(PH_{spin2})$ explained previously can now be made by forming a difference. This means that the semiconductor circuit arrangement 100 can be configured to form a difference between the first voltage signal $V_{Hallout}(PH_{spin1})$ and the second voltage signal $V_{Hallout}(PH_{spin2})$, meaning that:

$$V_{Hallout}(PH_{spin1})-V_{Hallout}(PH_{spin2})=+2\times f(\sigma_{xx}-\sigma_{yy}).$$

It can be seen that both the normal stress component $\sigma_{xy}$ and the dependency on the magnetic field component $B_z$ cancel each other out here. What remains is the dependency on the difference mechanical stress $\sigma_{xx}-\sigma_{yy}$ explained previously. A mechanical normal stress component, namely the difference mechanical stress $\sigma_{xx}-\sigma_{yy}$, can thus be ascertained in this form of implementation using forming the difference.

This also applies to the alternative shown in FIG. 5B, which means that using the variant shown in FIG. 5B a difference mechanical stress $\sigma_{xx}-\sigma_{yy}$ can also be ascertained using forming a difference. The form of implementation shown in FIG. 5B however uses the Hall bias voltage $V_{Hallbias}$ for this purpose in place of the Hall output voltage $V_{Hallout}$ discussed previously. This means that in FIG. 5B the first voltage signal is accessed between the terminals in the form of the Hall bias voltage $V_{Hallbias}(PH_{spin1})$ during the first clock phase $PH_{spin1}$, during which the Hall supply current 102 is also fed in, e.g. between the first terminal 111 and the second terminal 112. The second voltage signal is accessed between the terminals in the form of the Hall bias voltage $V_{Hallbias}(PH_{spin2})$ during the second clock phase $PH_{spin2}$, during which the Hall supply current 102 is also fed in, e.g. between the third terminal 113 and the fourth terminal 114.

The first electrical voltage signal $V_{Hallbias}(PH_{spin1})$ accessed during the first clock phase PH1 depends on the magnetic field component $B_z$ as well as on the aggregate mechanical stress, e.g. on the sum of the normal stress components in the x and y directions ($\sigma_{xx}+\sigma_{yy}$), and on the difference mechanical stress, e.g. on the difference between the normal stress components in the x and y directions ($\sigma_{xx}-\sigma_{yy}$). There is, however, no dependency on a shear stress component. The dependency on a normal stress component in the z direction $\sigma_{zz}$ is also negligible. The difference stress ($\sigma_{xx}-\sigma_{yy}$) here has a positive arithmetic sign during the first clock phase PH1, which means:

$$V_{Hallbias}(PH_{spin1})=f(B_z, (\sigma_{xx}+\sigma_{yy}), +(\sigma_{xx}-\sigma_{yy})).$$

The first voltage signal $V_{Hallbias}(PH_{spin1})$ thus accordingly has a first dependency on a mechanical stress of the semiconductor substrate.

The second electrical voltage signal $V_{Hallbias}(PH_{spin2})$ accessed during the second clock phase PH2 also depends on the magnetic field component $B_z$ as well as on the aggregate mechanical stress $\sigma_{xx}+\sigma_{yy}$ and on the difference mechanical stress $\sigma_{xx}-\sigma_{yy}$. The mechanical difference stress $\sigma_{xx}-\sigma_{yy}$ here however has a negative arithmetic sign during the second clock phase PH2, meaning that:

$$V_{Hallbias}(PH_{spin2})=f(B_z, (\sigma_{xx}+\sigma_{yy}), -(\sigma_{xx}-\sigma_{yy})).$$

The second voltage signal $V_{Hallbias}(PH_{spin2})$ thus accordingly has a second dependency on a mechanical stress of the semiconductor substrate. The normal stress component in the z direction $\sigma_{zz}$ is, also here in this arrangement, again negligible both in the first clock phase PH1 as well as in the second clock phase PH2.

According to the example implementation shown here in FIG. 5B, the combination of the two electrical voltage signals $V_{Hallbias}(PH_{spin1})$ and $V_{Hallbias}(PH_{spin2})$ explained previously can now also again be made by forming a difference. This means that the semiconductor circuit arrangement 100 can be configured to form a difference between the first voltage signal $V_{Hallbias}(PH_{spin1})$ and the second voltage signal $V_{Hallbias}(PH_{spin2})$, meaning that:

$$V_{Hallbias}(PH_{spin1})-V_{Hallbias}(PH_{spin2})=+2\times f(\sigma_{xx}-\sigma_{yy}).$$

Here again, both the normal stress component $\sigma_{xy}$ and the dependency on the magnetic field component $B_z$ cancel each other out. What remains is the dependency on the difference mechanical stress $\sigma_{xx}-\sigma_{yy}$ explained previously. A mechanical normal stress component, namely the difference mechanical stress $\sigma_{xx}-\sigma_{yy}$, can thus be ascertained in this variant implementation, alternative to FIG. 5A, using forming the difference.

It has been recognized that the mechanical stress components ascertained using the Hall sensor circuit 101 can be used to compensate for a negative influence of the respective mechanical stress component on the parametric accuracy and/or parametric stability of a component that is arranged on the semiconductor substrate but is separate from the Hall sensor circuit 101 or of a further circuit arrangement integrated into the semiconductor substrate. This means that although the mechanical stress of the semiconductor substrate is measured using the Hall sensor circuit 101, the stress components ascertained can be used for the compensation of other components.

In the example implementations described with reference to FIGS. 5A and 5B, the difference stress $\sigma_{xx}-\sigma_{yy}$ ascertained using the Hall sensor circuit 101 can be used to compensate for the parametric accuracy and/or parametric stability of other components, elements or integrated circuits that have a marked dependency on a difference stress.

Figure 5C:
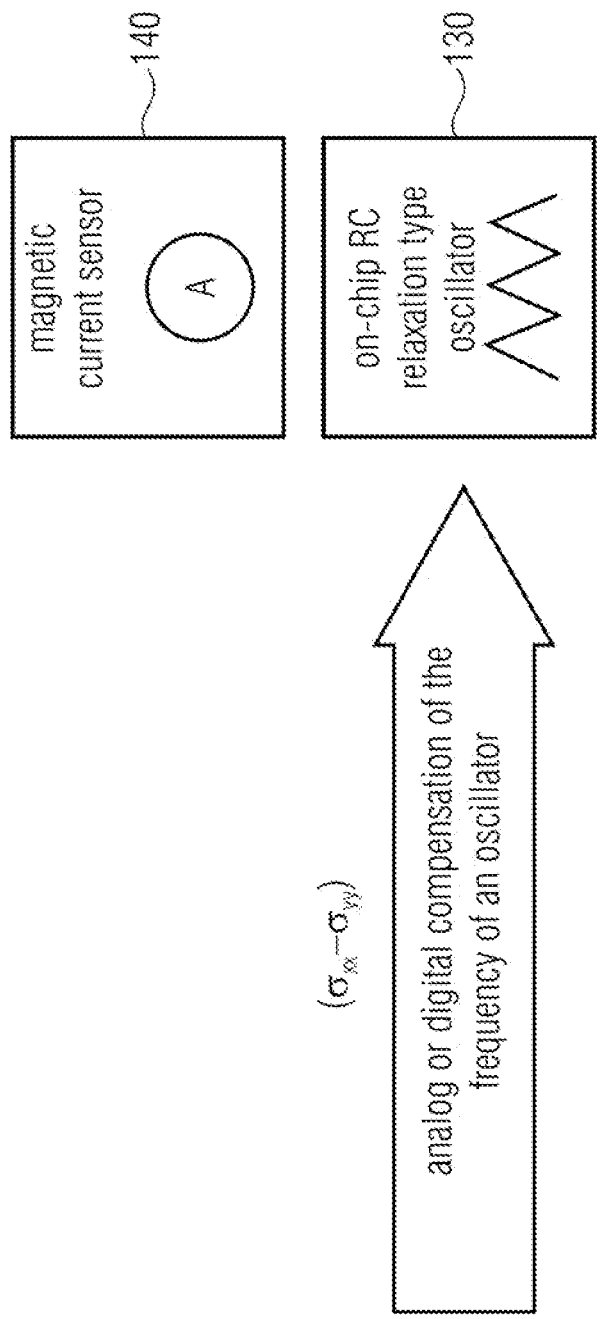
FIG. 5C shows a schematic view to illustrate a component separate from the Hall sensor circuit, whose stress-dependent parameter deviations can be compensated for through the application of the ascertained difference stress.

As is shown in FIG. 5C, an analog or digital compensation of a frequency deviation of an on-chip oscillator 130 can, for example, be carried out. Alternatively or in addition, the sensitivity of a separate magnetic flux sensor 140 separate from the Hall sensor circuit 101 can, for example, be increased.

Figure 6A:
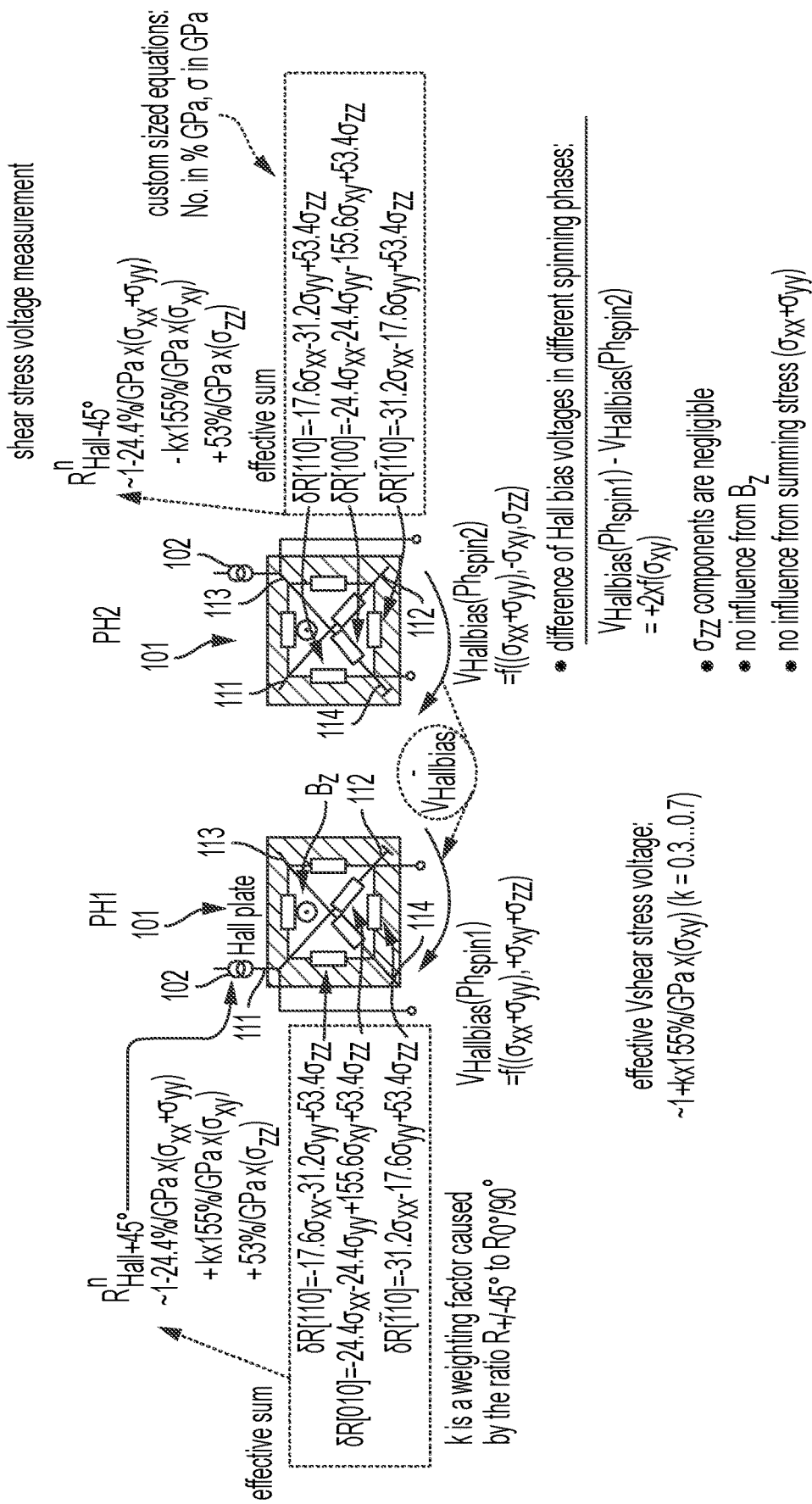
FIGS. 6A-6B show a schematic view of two example implementations of Hall sensor circuits that are configured to ascertain a shear stress.
Figure 6B:
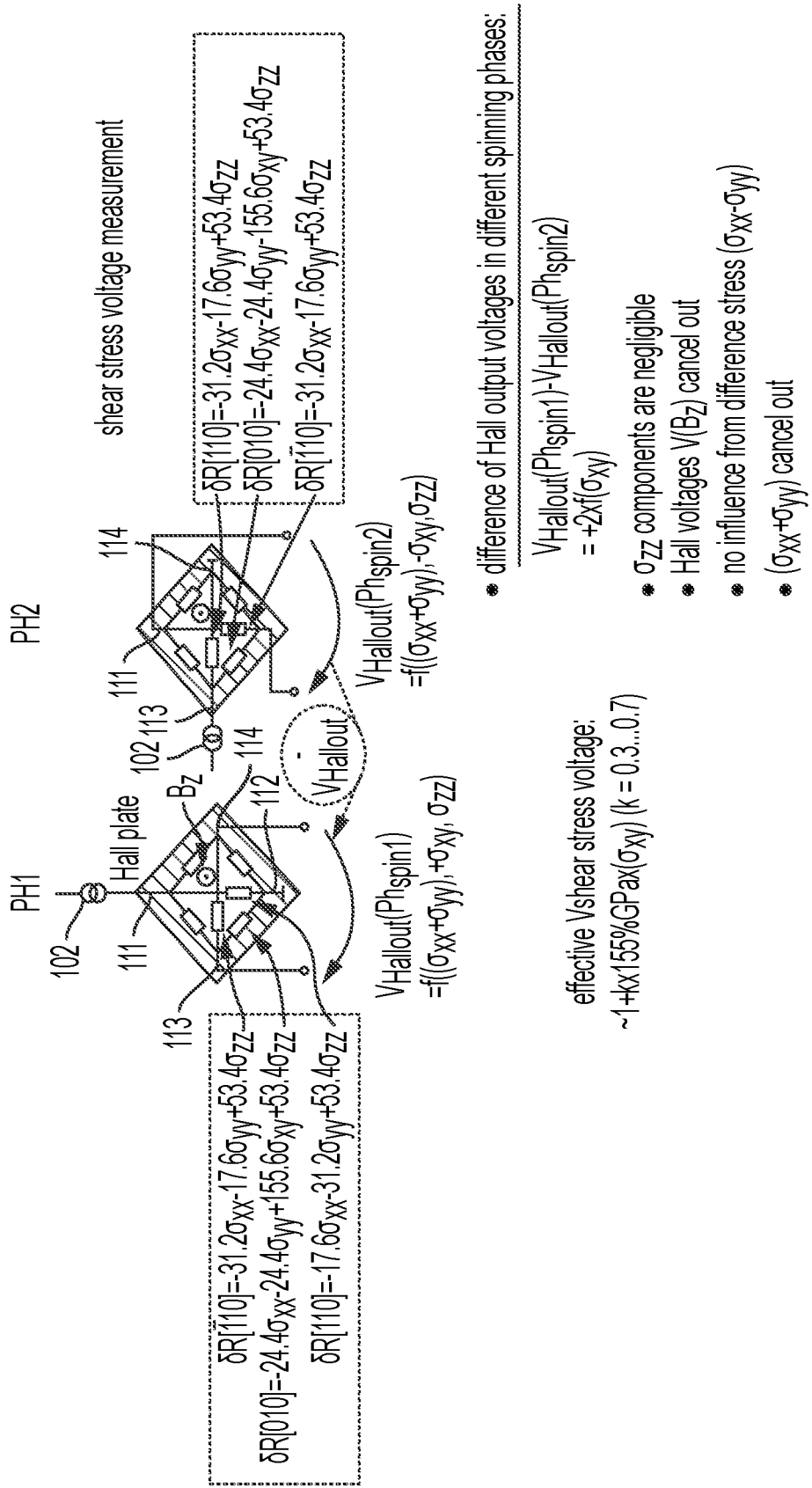

Two further forms of implementation of integrated Hall sensor circuits 101 are shown in FIGS. 6A and 6B. These forms of implementation can be employed in order to ascertain a shear stress component $\sigma_{xy}$.

In FIG. 6A the Hall supply current 102 is guided laterally through the Hall effect region during a first clock phase PH1 in a direction at +45° with respect to a normal to the primary flat plane, e.g., in the case of a {100} silicon substrate in the [010] direction. In a second clock phase PH2, the Hall supply current 102 is then guided laterally through the Hall effect region in a direction at −45° with respect to a normal to the primary flat plane, e.g., in the case of a {100} silicon substrate in the [100] direction.

FIG. 6B shows a Hall sensor circuit 101, or a horizontal Hall plate 101, that is rotated through 45° with respect to the horizontal Hall plate 101 shown in FIG. 6A. In FIG. 6B the Hall supply current 102 is guided laterally through the Hall effect region during a first clock phase PH1 in a direction at 0° with respect to a normal to the primary flat plane, e.g., in the case of a {100} silicon substrate in the [110] direction. In a second clock phase PH2, the Hall supply current 102 is then guided laterally through the Hall effect region in a direction at 90° with respect to a normal to the primary flat plane, e.g., in the case of a {100} silicon substrate in the [1̄10] direction.

The flow of the Hall supply current 102 here again also generates an electrical voltage in the Hall effect region of the integrated Hall sensor circuit 101. This electrical voltage can be accessed in the form of an electrical voltage signal at, for example, two of the total of four terminals 111, 112, 113, 114. An electrical voltage signal in the form of a Hall output voltage $V_{Hallout}$ can, for example, be accessed at the two terminals at which the Hall supply current 102 is not fed in. On the other hand, an electrical voltage signal in the form of a Hall bias voltage $V_{Hallbias}$ can be accessed at the terminals at which the Hall supply current 102 is fed in.

A first voltage signal $V_{Hallout}(PH_{spin1})$ or $V_{Hallbias}(PH_{spin1})$ can accordingly be accessed in the first clock phase PH1, and a second voltage signal $V_{Hallout}(PH_{spin2})$ or $V_{Hallbias}(PH_{spin2})$ can accordingly be accessed in the second clock phase PH2. The first voltage signal $V_{Hallout}(PH_{spin1})$ or $V_{Hallbias}(PH_{spin1})$ has a first dependency on a mechanical stress of the semiconductor substrate, and the second voltage signal $V_{Hallout}(PH_{spin2})$ or $V_{Hallbias}(PH_{spin2})$ has a different, second dependency on a mechanical stress of the semiconductor substrate.

Expressed more generally, the Hall sensor circuit 101 according to the subject matter described herein, is configured to guide a Hall supply current 102 between the first terminal 111 and the opposite, second terminal 112 at a first angle $\Phi_1$ to a normal to a primary flat plane of the semiconductor substrate, laterally through a Hall effect region during a first clock phase $PH_{spin1}$, and to generate a first electrical voltage signal $V_{Hallout}(PH_{spin1})$ or $V_{Hallbias}(PH_{spin1})$ in the Hall effect region, wherein the first electrical voltage signal $V_{Hallout}(PH_{spin1})$ or $V_{Hallbias}(PH_{spin1})$ has a first dependency on a mechanical stress of the semiconductor substrate. In the case of FIG. 6A, the first angle is $\Phi_1=+45°$, and in the case of FIG. 6B the first angle is $\Phi_1=0°$.

The Hall sensor circuit 101 is furthermore configured to guide a Hall supply current 102 between the third terminal 113 and the opposite, fourth terminal 114 at a second angle $\Phi_2$ that is orthogonal to the first angle $\Phi_1$, laterally through the Hall effect region during a second clock phase $PH_{spin2}$, and to generate a second electrical voltage signal $V_{Hallout}(PH_{spin2})$ or $V_{Hallbias}(PH_{spin2})$ in the Hall effect region, wherein the second electrical voltage signal $V_{Hallout}(PH_{spin2})$ or $V_{Hallbias}(PH_{spin2})$ has a second dependency on a mechanical stress of the semiconductor substrate. In the case of FIG. 6A, the second angle is $\Phi_2=-45°$, and in the case of FIG. 6B the second angle is $\Phi_2=90°$.

According to the example implementation illustrated in FIGS. 6A and 6B, the semiconductor circuit arrangement 100 is furthermore configured to ascertain a specific mechanical stress component, in this case a shear stress component, and to do so based on a combination of the first electrical voltage signal $V_{Hallout}(PH_{spin1})$ or $V_{Hallbias}(PH_{spin1})$ and of the second electrical voltage signal $V_{Hallout}(PH_{spin2})$ or $V_{Hallbias}(PH_{spin2})$.

In FIG. 6A a Hall bias voltage $V_{Hallbias}(PH_{spin2})$ or $V_{Hallbias}(PH_{spin2})$ is accessed during both the first clock phase PH1 and the second clock phase PH2 at whichever terminals the Hall supply current 102 is also being fed in. This means that a first electrical voltage signal is accessed in the form of a first Hall bias voltage $V_{Hallbias}(PH_{spin1})$ at the first terminal 111 and at the second terminal 112 during the first clock phase PH1, and a second electrical voltage signal in the form of a second Hall bias voltage $V_{Hallbias}(PH_{spin2})$ is accessed at the third terminal 113 and at the fourth terminal 114 during the second clock phase PH2.

The first electrical voltage signal $V_{Hallbias}(PH_{spin1})$ accessed during the first clock phase PH1 depends neither on the magnetic field component $B_z$ nor on the difference stress $(\sigma_{xx}-\sigma_{yy})$. It does, however, depend on the aggregate mechanical stress, e.g. on a sum of the normal stress components in the x and y directions $(\sigma_{xx}+\sigma_{yy})$ and on a normal mechanical stress component in the z direction, e.g. on the normal stress $\sigma_{zz}$ as well as on a mechanical shear stress $\sigma_{xy}$. The mechanical shear stress component $\sigma_{xy}$ here has a positive arithmetic sign during the first clock phase PH1, which means:

$$V_{Hallbias}(PH_{spin1})=f((\sigma_{xx}+\sigma_{yy}), +\sigma_{xy}, \sigma_{zz}).$$

The first voltage signal $V_{Hallbias}(PH_{spin1})$ thus accordingly has a first dependency on a mechanical stress of the semiconductor substrate.

The second electrical voltage signal $V_{Hallbias}(PH_{spin2})$ accessed during the second clock phase PH2 again depends neither on the magnetic field component $B_z$ nor on the difference stress $(\sigma_{xx}-\sigma_{yy})$. It does, however, once again depend on the aggregate mechanical stress, e.g. on a sum of the normal stress components in the x and y directions $(\sigma_{xx}+\sigma_{yy})$ and on a normal mechanical stress component in the z direction, e.g. on the normal stress $\sigma_{zz}$ as well as on a mechanical shear stress $\sigma_{xy}$. The mechanical shear stress component $\sigma_{xy}$ here however has a negative arithmetic sign during the second clock phase PH2, which means:

$$V_{Hallbias}(PH_{spin2})=f((\sigma_{xx}+\sigma_{yy}), -\sigma_{xy}, \sigma_{zz}).$$

The second voltage signal $V_{Hallbias}(PH_{spin2})$ thus accordingly has a second dependency on a mechanical stress of the semiconductor substrate.

According to the example implementation shown here in FIG. 6A, the combination of the two electrical voltage signals $V_{Hallbias}(PH_{spin1})$ and $V_{Hallbias}(PH_{spin2})$ explained previously can now be made by forming a difference. This means that the semiconductor circuit arrangement 100 can be configured to form a difference between the first voltage signal $V_{Hallbias}(PH_{spin1})$ and the second voltage signal $V_{Hallbias}(PH_{spin2})$, meaning that:

$$V_{Hallbias}(PH_{spin1}) - V_{Hallbias}(PH_{spin2}) = +2 \times f(\sigma_{xy}).$$

It can be seen that both the normal stress component in the z direction $\sigma_{zz}$ as well as the dependency on the magnetic field component $B_z$ and the aggregate mechanical stress $(\sigma_{xx}+\sigma_{yy})$ cancel each other out. What remains is the dependency on the mechanical shear stress component $\sigma_{xy}$ explained previously. A mechanical shear stress component $\sigma_{xy}$ can thus be ascertained in this form of implementation using forming the difference.

This also applies to the alternative shown in FIG. 6B, which means that using the variant shown in FIG. 6B a mechanical shear stress component $\sigma_{xy}$ can also be ascertained using forming a difference. The form of implementation shown in FIG. 6B however uses the Hall output voltage $V_{Hallout}$ for this purpose in place of the Hall bias voltage $V_{Hallbias}$ discussed previously. This means that in FIG. 6B the first voltage signal is accessed between the terminals in the form of the Hall output voltage $V_{Hallout}(PH_{spin1})$ during the first clock phase $PH_{spin1}$, during which the Hall supply current 102 is not being fed in, e.g. between the third terminal 113 and the fourth terminal 114. The second voltage signal is accessed between the terminals in the form of the Hall output voltage $V_{Hallout}(PH_{spin2})$ during the second clock phase $PH_{spin2}$, during which the Hall supply current 102 is not being fed in, e.g. between the first terminal 111 and the second terminal 112.

The first electrical voltage signal $V_{Hallout}(PH_{spin1})$ accessed during the first clock phase PH1 depends neither on the magnetic field component $B_z$ nor on the difference stress $\sigma_{xx}-\sigma_{yy}$. It does, however, depend on the aggregate mechanical stress, e.g. on a sum of the normal stress components $\sigma_{xx}+\sigma_{yy}$, and on a normal mechanical stress component in the z direction, e.g. on the normal stress $\sigma_{zz}$ as well as on a mechanical shear stress $\sigma_{xy}$. The mechanical shear stress component $\sigma_{xy}$ here has a positive arithmetic sign during the first clock phase PH1, which means:

$$V_{Hallout}(PH_{spin1}) = f((\sigma_{xx}+\sigma_{yy}), +\sigma_{xy}, \sigma_{zz}).$$

The first voltage signal $V_{Hallout}(PH_{spin1})$ thus accordingly has a first dependency on a mechanical stress of the semiconductor substrate.

The second electrical voltage signal $V_{Hallout}(PH_{spin2})$ accessed during the second clock phase PH2 again depends neither on the magnetic field component $B_z$ nor on the difference stress $\sigma_{xx}-\sigma_{yy}$. It does, however, again also depend on the aggregate mechanical stress, e.g. on a sum of the normal stress components $\sigma_{xx}+\sigma_{yy}$, and on a normal mechanical stress component in the z direction, e.g. on the normal stress $\sigma_{zz}$ as well as on a mechanical shear stress $\sigma_{xy}$. The mechanical shear stress component $\sigma_{xy}$ here however has a negative arithmetic sign during the second clock phase PH2, which means:

$$V_{Hallout}(PH_{spin2}) = f((\sigma_{xx}+\sigma_{yy}), -\sigma_{xy}, \sigma_{zz}).$$

The second voltage signal $V_{Hallout}(PH_{spin2})$ thus accordingly has a second dependency on a mechanical stress of the semiconductor substrate.

According to the example implementation shown here in FIG. 6B, the combination of the two electrical voltage signals $V_{Hallout}(PH_{spin1})$ and $V_{Hallout}(PH_{spin2})$ explained previously can now also again be made by forming a difference. This means that the semiconductor circuit arrangement 100 can be configured to form a difference between the first voltage signal $V_{Hallout}(PH_{spin1})$ and the second voltage signal $V_{Hallout}(PH_{spin2})$, meaning that:

$$V_{Hallout}(PH_{spin1}) - V_{Hallout}(PH_{spin2}) = +2 \times f(\sigma_{xy}).$$

Here again, both the normal stress component in the z direction $\sigma_{zz}$ as well as the dependency on the magnetic field component $B_z$ and the aggregate mechanical stress $(\sigma_{xx}+\sigma_{yy})$ cancel each other out. What remains is the dependency on the mechanical shear stress component $\sigma_{xy}$ explained previously. In this variant implementation, which is alternative to that of FIG. 6A, a mechanical shear stress component $\sigma_{xy}$ can thus be ascertained using forming the difference.

It has been recognized that the mechanical stress components ascertained using the Hall sensor circuit 101 can be used to compensate for a negative influence of the respective mechanical stress component on the parametric accuracy and/or parametric stability of a component that is arranged on the semiconductor substrate but is separate from the Hall sensor circuit 101 or of a further circuit arrangement integrated into the semiconductor substrate. This means that although the mechanical stress of the semiconductor substrate is measured using the Hall sensor circuit 101, the stress component ascertained (here: shear stress $\sigma_{xy}$) can be used for the compensation of other components.

In the example implementations described with reference to FIGS. 6A and 6B, the shear stress $\sigma_{xy}$ ascertained using the Hall sensor circuit 101 can be used to compensate for the parametric accuracy and/or parametric stability of other components, elements or integrated circuits that have a marked dependency on a shear stress $\sigma_{xy}$.

Figure 6C:
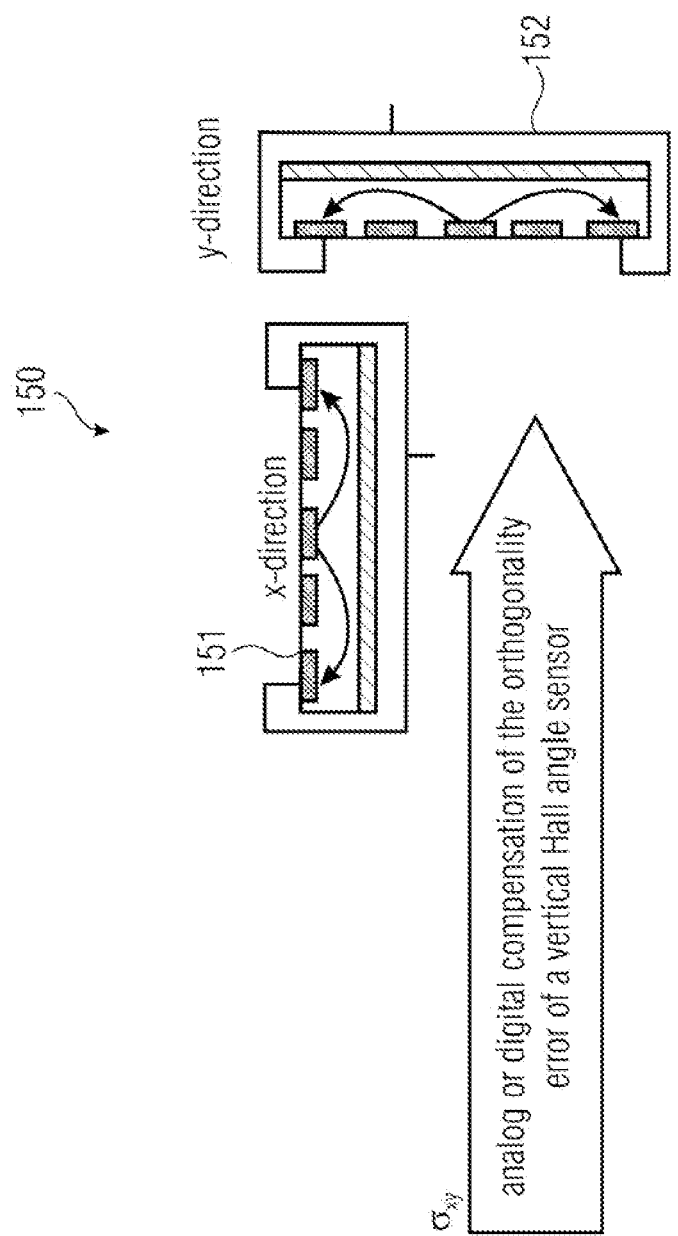
FIG. 6C shows a schematic view to illustrate a component separate from the Hall sensor circuit, whose stress-dependent parameter deviations can be compensated for through the application of the ascertained shear stress.

As is shown in FIG. 6C, an analog or digital compensation for an orthogonality error of an angle sensor 150 based on the Hall effect with a horizontal Hall plate 151 and a vertical Hall device 152, and separate from the Hall sensor circuit 101, can, for example, be carried out.

Figure 7A:
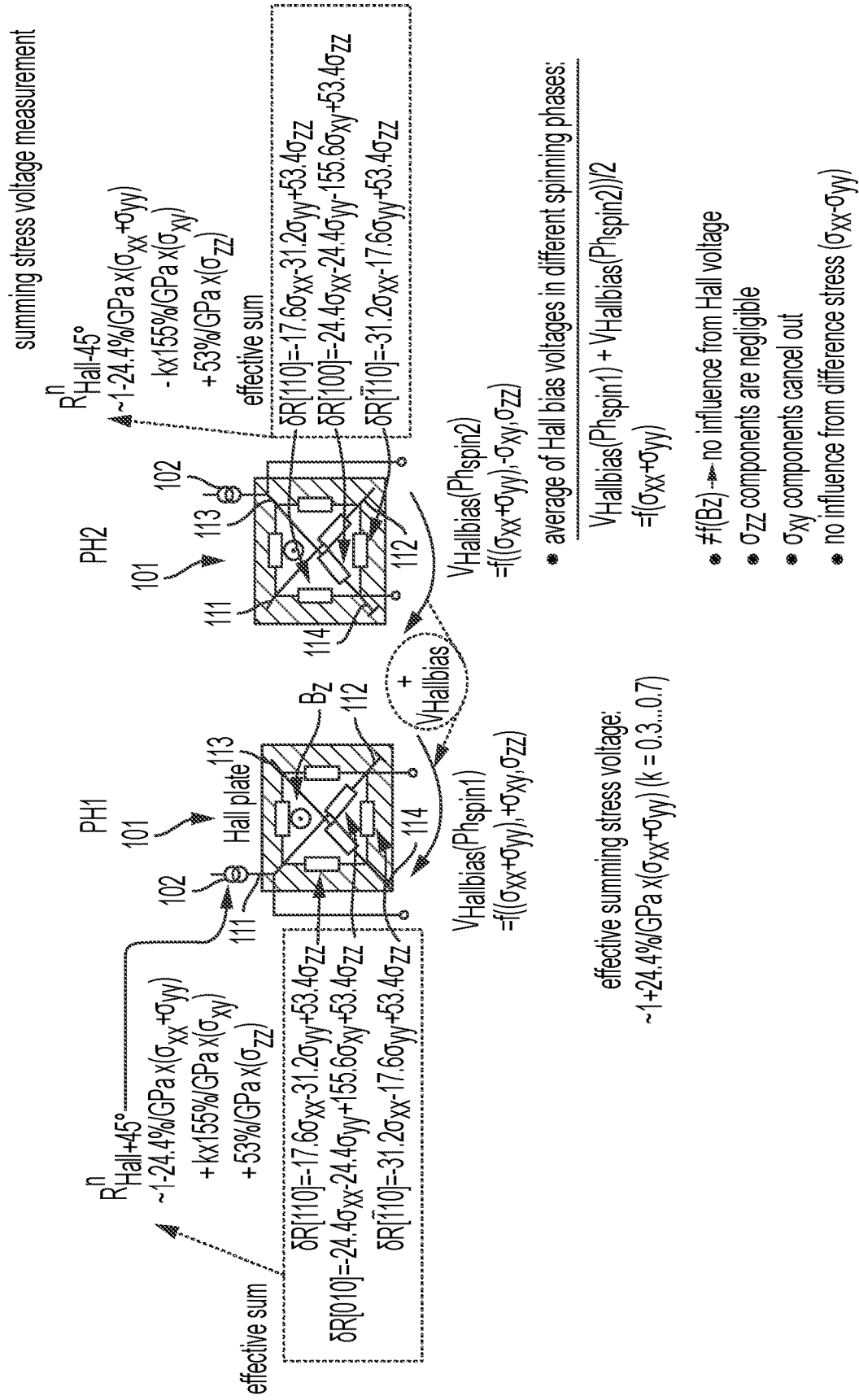
FIGS. 7A-7B show a schematic view of two example implementations of Hall sensor circuits that are configured to ascertain an aggregate stress.
Figure 7B:
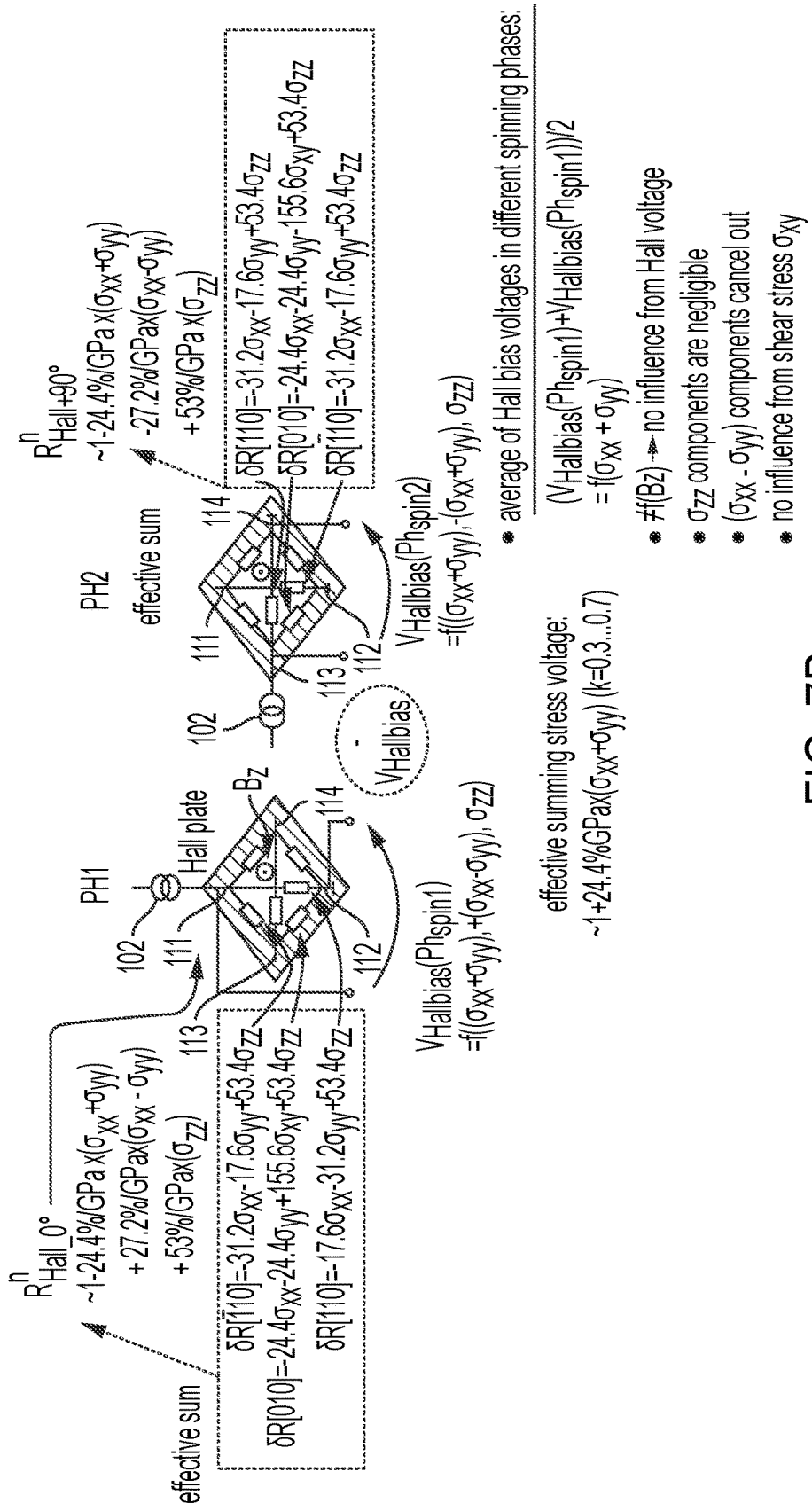

Two further forms of implementation of integrated Hall sensor circuits 101 are shown in FIGS. 7A and 7B. These forms of implementation can be employed to ascertain a normal stress component, and in particular what is known as an aggregate mechanical stress $(\sigma_{xx}+\sigma_{yy})$.

In FIG. 7A the Hall supply current 102 is guided laterally through the Hall effect region during a first clock phase PH1 in a direction at +45° with respect to a normal to the primary flat plane, e.g., in the case of a {100} silicon substrate in the [010] direction. In a second clock phase PH2, the Hall supply current 102 is then guided laterally through the Hall effect region in a direction at −45° with respect to a normal to the primary flat plane, e.g., in the case of a {100} silicon substrate in the [100] direction.

FIG. 7B shows a Hall sensor circuit 101, or a horizontal Hall plate 101, that is rotated through 45° with respect to the horizontal Hall plate 101 shown in FIG. 7A. In FIG. 7B the Hall supply current 102 is guided laterally through the Hall effect region during a first clock phase PH1 in a direction at 0° with respect to a normal to the primary flat plane, e.g., in the case of a {100} silicon substrate in the [110] direction. In a second clock phase PH2, the Hall supply current 102 is then guided laterally through the Hall effect region in a direction at 90° with respect to a normal to the primary flat plane, e.g., in the case of a {100} silicon substrate in the [$\bar{1}$10] direction.

The flow of the Hall supply current 102 here again also generates an electrical voltage in the Hall effect region of the integrated Hall sensor circuit 101. This electrical voltage can be accessed in the form of an electrical voltage signal at, for example, two of the total of four terminals 111, 112, 113, 114. An electrical voltage signal in the form of a Hall output voltage $V_{Hallout}$ can, for example, be accessed at the two terminals at which the Hall supply current 102 is not fed in. On the other hand, an electrical voltage signal in the form of a Hall bias voltage $V_{Hallbias}$ can be accessed at the terminals at which the Hall supply current 102 is fed in.

A first voltage signal $V_{Hallout}(PH_{spin1})$ or $V_{Hallbias}(PH_{spin1})$ can accordingly be accessed in the first clock phase PH1, and a second voltage signal $V_{Hallout}(PH_{spin2})$ or $V_{Hallbias}(PH_{spin2})$ can accordingly be accessed in the second clock phase PH2. The first voltage signal $V_{Hallout}(PH_{spin1})$ or $V_{Hallbias}(PH_{spin1})$ has a first dependency on a mechanical stress of the semiconductor substrate, and the second voltage signal $V_{Hallout}(PH_{spin2})$ or $V_{Hallbias}(PH_{spin2})$ has a different, second dependency on a mechanical stress of the semiconductor substrate.

Expressed more generally, the Hall sensor circuit 101 according to the subject matter described herein, is configured to guide a Hall supply current 102 between the first terminal 111 and the opposite, second terminal 112 at a first angle $\Phi_1$ to a normal to a primary flat plane of the semiconductor substrate, laterally through a Hall effect region during a first clock phase $PH_{spin1}$, and to generate a first electrical voltage signal $V_{Hallout}(PH_{spin1})$ or $V_{Hallbias}(PH_{spin1})$ in the Hall effect region, wherein the first electrical voltage signal $V_{Hallout}(PH_{spin1})$ or $V_{Hallbias}(PH_{spin1})$ has a first dependency on a mechanical stress of the semiconductor substrate. In the case of FIG. 7A, the first angle is $\Phi_1=+45°$, and in the case of FIG. 7B the first angle is $\Phi_1=0°$.

The Hall sensor circuit 101 is furthermore configured to guide a Hall supply current 102 between the third terminal 113 and the opposite, fourth terminal 114 at a second angle $\Phi_2$ that is orthogonal to the first angle $\Phi_1$, laterally through the Hall effect region during a second clock phase $PH_{spin2}$, and to generate a second electrical voltage signal $V_{Hallout}(PH_{spin2})$ or $V_{Hallbias}(PH_{spin2})$ in the Hall effect region, wherein the second electrical voltage signal $V_{Hallout}(PH_{spin2})$ or $V_{Hallbias}(PH_{spin2})$ has a second dependency on a mechanical stress of the semiconductor substrate. In the case of FIG. 7A, the second angle is $\Phi_2=-45°$, and in the case of FIG. 7B the second angle is $\Phi_2=90°$.

According to the example implementation illustrated in FIGS. 7A and 7B, the semiconductor circuit arrangement 100 is furthermore configured to ascertain a specific mechanical stress component, in this case an aggregate mechanical stress, e.g. the sum of the normal stress components in the x and y directions $(\sigma_{xx}+\sigma_{yy})$, and to do so based on a combination of the first electrical voltage signal $V_{Hallout}(PH_{spin1})$ or $V_{Hallbias}(PH_{spin1})$ and of the second electrical voltage signal $V_{Hallout}(PH_{spin2})$ or $V_{Hallbias}(PH_{spin2})$.

In FIG. 7A a Hall bias voltage $V_{Hallbias}(PH_{spin1})$ or $V_{Hallbias}(PH_{spin2})$ is accessed during both the first clock phase PH1 and the second clock phase PH2 at whichever terminals the Hall supply current 102 is also being fed in. This means that a first electrical voltage signal is accessed in the form of a first Hall bias voltage $V_{Hallbias}(PH_{spin1})$ at the first terminal 111 and at the second terminal 112 during the first clock phase PH1, and a second electrical voltage signal in the form of a second Hall bias voltage $V_{Hallbias}(PH_{spin2})$ is accessed at the third terminal 113 and at the fourth terminal 114 during the second clock phase PH2.

The first electrical voltage signal $V_{Hallbias}(PH_{spin1})$ accessed during the first clock phase PH1 depends neither on the magnetic field component $B_z$ nor on the difference stress $(\sigma_{xx}-\sigma_{yy})$. It does, however, depend on the aggregate mechanical stress, e.g. on a sum of the normal stress components in the x and y directions $(\sigma_{xx}+\sigma_{yy})$ and on a normal mechanical stress component in the z direction, e.g. on the normal stress $\sigma_{zz}$ as well as on a mechanical shear stress $\sigma_{xy}$. The mechanical shear stress component $\sigma_{xy}$ here has a positive arithmetic sign during the first clock phase PH1, which means:

$$V_{Hallbias}(PH_{spin1})=f((\sigma_{xx}+\sigma_{yy}), +\sigma_{xy}, \sigma_{zz}).$$

The first voltage signal $V_{Hallbias}(PH_{spin1})$ thus accordingly has a first dependency on a mechanical stress of the semiconductor substrate.

The second electrical voltage signal $V_{Hallbias}(PH_{spin2})$ accessed during the second clock phase PH2 again depends neither on the magnetic field component $B_z$ nor on the difference stress $(\sigma_{xx}-\sigma_{yy})$. It does, however, once again depend on the aggregate mechanical stress, e.g. on a sum of the normal stress components in the x and y directions $(\sigma_{xx}+\sigma_{yy})$ and on a normal mechanical stress component in the z direction, e.g. on the normal stress $\sigma_{zz}$ as well as on a mechanical shear stress $\sigma_{xy}$. The mechanical shear stress component $\sigma_{xy}$ here however has a negative arithmetic sign during the second clock phase PH2, which means:

$$V_{Hallbias}(PH_{spin2})=f((\sigma_{xx}+\sigma_{yy}), -\sigma_{xy}, \sigma_{zz}).$$

The second voltage signal $V_{Hallbias}(PH_{spin2})$ thus accordingly has a second dependency on a mechanical stress of the semiconductor substrate.

According to the example implementation shown here in FIG. 7A, the combination of the two electrical voltage signals $V_{Hallbias}(PH_{spin1})$ and $V_{Hallbias}(PH_{spin2})$ explained previously can now be made by forming a sum or an average. This means that the semiconductor circuit arrangement 100 can be configured to form a sum or an average of the first voltage signal $V_{Hallbias}(PH_{spin1})$ and the second voltage signal $V_{Hallbias}(PH_{spin2})$, meaning that:

$$(V_{Hallbias}(PH_{spin1})+V_{Hallbias}(PH_{spin2}))/2=f(\sigma_{xx}+\sigma_{yy}).$$

It can be seen that both the normal stress component in the z direction $\sigma_{zz}$ as well as the dependency on the magnetic field component $B_z$ and on the difference mechanical stress $(\sigma_{xx}-\sigma_{yy})$ cancel each other out. The dependency on the previously explained aggregate mechanical stress, e.g. the sum of the normal stress components in the x and y directions $(\sigma_{xx}+\sigma_{yy})$ remains. A mechanical normal stress component $(\sigma_{xx}+\sigma_{yy})$ can thus be ascertained in this form of implementation using forming the sum or average.

This also applies to the alternative shown in FIG. 7B, which means that using the variant shown in FIG. 7B a normal mechanical stress component, and in particular the aggregate stress $(\sigma_{xx}+\sigma_{yy})$, can also be ascertained using forming a sum or an average. A Hall bias voltage $V_{Hallbias}$ can likewise be used for this purpose in the form of implementation shown in FIG. 7B. This means that in FIG. 7B the first voltage signal is accessed between the terminals in the form of the Hall bias voltage $V_{Hallbias}(PH_{spin1})$ during the first clock phase $PH_{spin1}$, during which the Hall supply current 102 is fed in, e.g. between the first terminal 111 and the second terminal 112. The second voltage signal is also accessed between the terminals in the form of the Hall bias voltage $V_{Hallbias}(PH_{spin2})$ during the second clock phase $PH_{spin2}$, during which the Hall supply current 102 is fed in, e.g. between the third terminal 113 and the fourth terminal 114.

The first electrical voltage signal $V_{Hallbias}(PH_{spin1})$ accessed during the first clock phase PH1 depends neither on the magnetic field component $B_z$ nor on the mechanical shear stress component $\sigma_{xy}$. It does, however, depend on the aggregate mechanical stress, e.g. on a sum of the normal stress components in the x and y directions $(\sigma_{xx}+\sigma_{yy})$, on the difference mechanical stress, e.g. on a difference between the normal stress components in the x and y directions $(\sigma_{xx}-\sigma_{yy})$, as well as on a mechanical normal stress component in the z direction, e.g. on the normal stress $\sigma_{zz}$. The difference mechanical stress $(\sigma_{xx}-\sigma_{yy})$ here has a positive arithmetic sign during the first clock phase PH1, which means:

$$V_{Hallbias}(PH_{spin1})=f((\sigma_{xx}+\sigma_{yy}), +(\sigma_{xx}-\sigma_{yy}), \sigma_{zz}).$$

The first voltage signal $V_{Hallbias}(PH_{spin1})$ thus accordingly has a first dependency on a mechanical stress of the semiconductor substrate.

The second electrical voltage signal $V_{Hallbias}(PH_{spin2})$ accessed during the second clock phase PH2 likewise depends neither on the magnetic field component $B_z$ nor on the mechanical shear stress component $\sigma_{xy}$. It does, however, depend on the aggregate mechanical stress, e.g. on a sum of the normal stress components in the x and y directions $(\sigma_{xx}+\sigma_{yy})$, on the difference mechanical stress, e.g. on a difference between the normal stress components in the x and y directions $(\sigma_{xx}-\sigma_{yy})$, as well as on a mechanical normal stress component in the z direction, e.g. on the normal stress $\sigma_{zz}$. The difference mechanical stress $(\sigma_{xx}-\sigma_{yy})$ here however has a negative arithmetic sign during the second clock phase PH2, which means:

$$V_{Hallbias}(PH_{spin2})=f((\sigma_{xx}+\sigma_{yy}), -(\sigma_{xx}-\sigma_{yy}), \sigma_{zz}).$$

The second voltage signal $V_{Hallbias}(PH_{spin2})$ thus accordingly has a second dependency on a mechanical stress of the semiconductor substrate.

According to the example implementation shown here in FIG. 7B, the combination of the two electrical voltage signals $V_{Hallbias}(PH_{spin1})$ and $V_{Hallbias}(PH_{spin2})$ explained previously can now once again be made by forming a sum or an average. This means that the semiconductor circuit arrangement 100 can be configured to form a sum or an average of the first voltage signal $V_{Hallbias}(PH_{spin1})$ and the second voltage signal $V_{Hallbias}(PH_{spin2})$, meaning that:

$$(V_{Hallbias}(PH_{spin1})+V_{Hallbias}(PH_{spin2}))/2=f(\sigma_{xx}+\sigma_{yy}).$$

Here again, both the normal stress component in the z direction $\sigma_{zz}$ as well as the dependency on the magnetic field component $B_z$ and on the difference mechanical stress $(\sigma_{xx}-\sigma_{yy})$ cancel each other out. The dependency on the previously explained aggregate mechanical stress, e.g. the sum of the normal stress components in the x and y directions $(\sigma_{xx}+\sigma_{yy})$ remains. A mechanical normal stress component $(\sigma_{xx}+\sigma_{yy})$ can thus be ascertained in this form of implementation using forming the sum or average.

It has been recognized that the mechanical stress component ascertained using the Hall sensor circuit 101 can be used to compensate for a negative influence of the respective mechanical stress component on the parametric accuracy and/or parametric stability of a component that is arranged on the semiconductor substrate but is separate from the Hall sensor circuit 101 or of a further circuit arrangement integrated into the semiconductor substrate. This means that although the mechanical stress of the semiconductor substrate is measured using the Hall sensor circuit 101, the stress component ascertained (here: aggregate stress $(\sigma_{xx}+\sigma_{yy})$) can be used for the compensation of other components.

In the example implementations described with reference to FIGS. 7A and 7B, the aggregate stress $(\sigma_{xx}+\sigma_{yy})$ ascertained using the Hall sensor circuit 101 can be used to compensate for the parametric accuracy and/or parametric stability of other components, elements or integrated circuits that have a marked dependency on an aggregate stress $(\sigma_{xx}+\sigma_{yy})$.

Figure 7C:
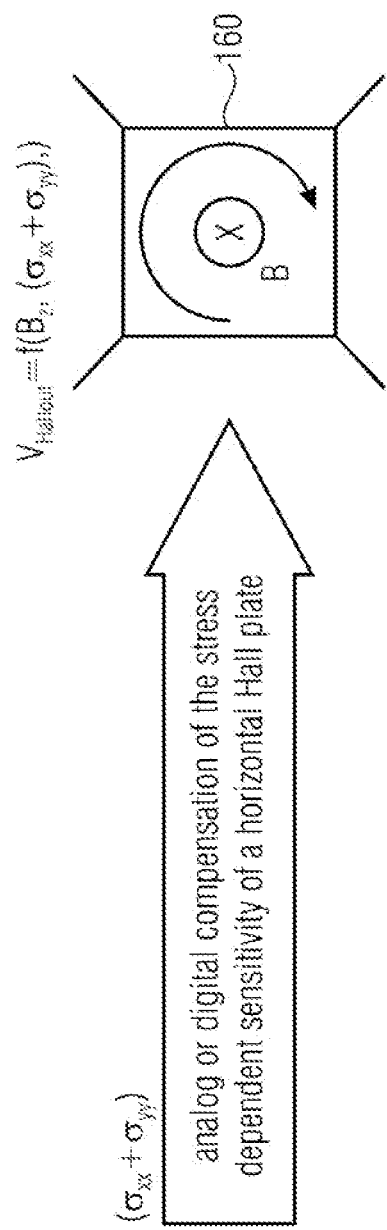
FIG. 7C shows a schematic view to illustrate a component separate from the Hall sensor circuit, whose stress-dependent parameter deviations can be compensated for through the application of the ascertained aggregate stress.

As is shown in FIG. 7C, an analog or digital compensation of a sensitivity deviation of a separate horizontal Hall plate 160 can, for example, be carried out, e.g. the sensitivity, that is dependent on the aggregate stress, of the separate Hall plate 160 can be increased.

Figure 8A:
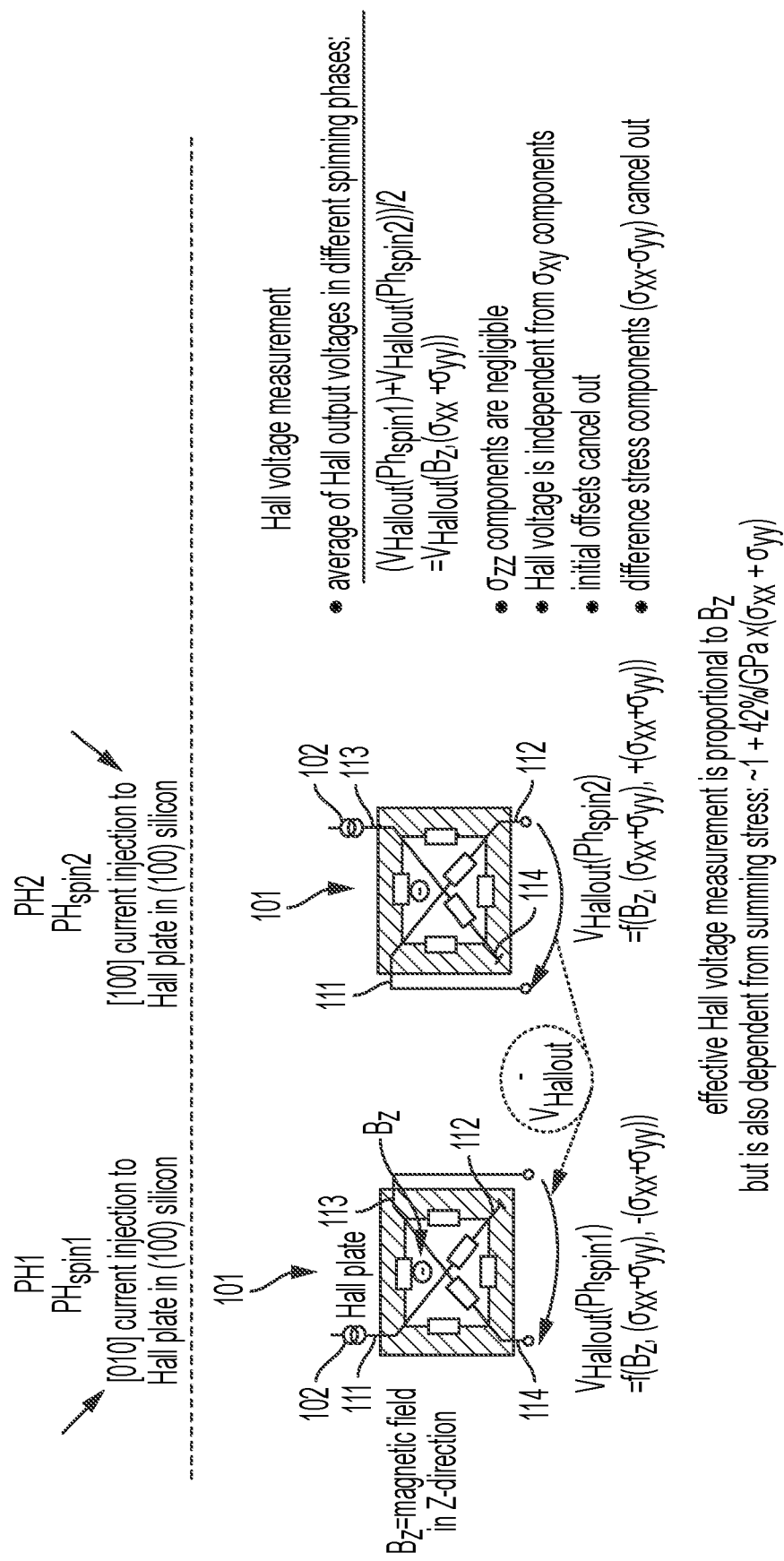
FIG. 8A shows a schematic view of an example implementation of a Hall sensor circuit that is configured to measure a magnetic field and to ascertain an aggregate stress.
Figure 8B:
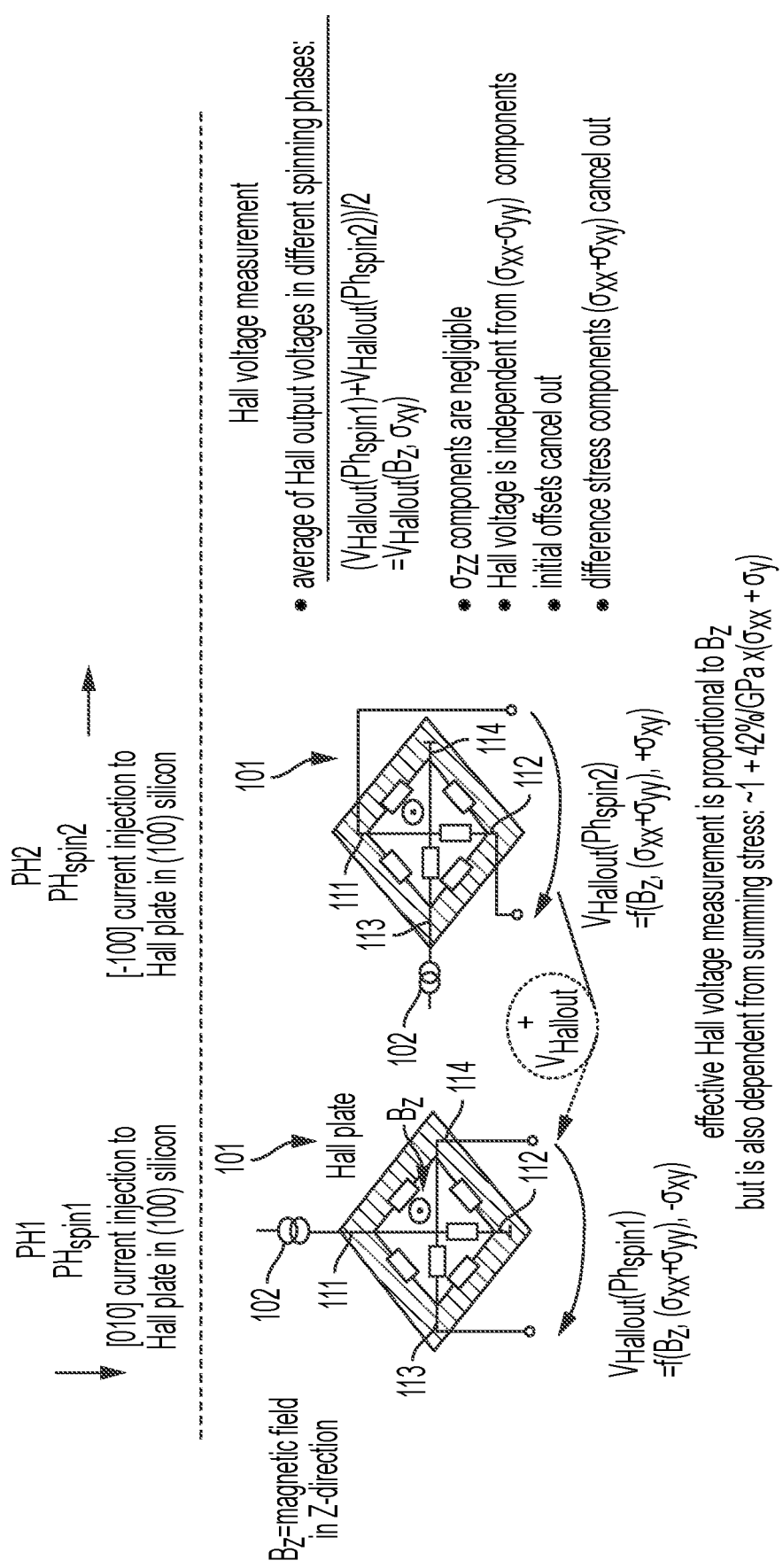
FIG. 8B shows a schematic view of an example implementation of a Hall sensor circuit that is configured to measure a magnetic field and to ascertain a shear stress.

Two further forms of implementation of integrated Hall sensor circuits 101 are shown in FIGS. 8A and 8B. These forms of implementation can be employed to measure a magnetic field component $B_z$ and, in addition, to ascertain a mechanical stress component. In the form of implementation shown in FIG. 8A, a normal stress component and, in particular, what is known as an aggregate mechanical stress, e.g. the sum of the normal stress components in the x and y directions $(\sigma_{xx}+\sigma_{yy})$ can, for example, be ascertained. In the form of implementation shown in FIG. 8B, a shear stress component $\sigma_{xy}$ can, for example, be ascertained.

In FIG. 8A the Hall supply current 102 is guided laterally through the Hall effect region during a first clock phase PH1 in a direction at +45° with respect to a normal to the primary flat plane, e.g., in the case of a {100} silicon substrate in the [010] direction. In a second clock phase PH2, the Hall supply current 102 is then guided laterally through the Hall effect region in a direction at −45° with respect to a normal to the primary flat plane, e.g., in the case of a {100} silicon substrate in the [100] direction.

FIG. 8B shows a Hall sensor circuit 101, or a horizontal Hall plate 101, that is rotated through 45° with respect to the horizontal Hall plate 101 shown in FIG. 8A. In FIG. 8B the Hall supply current 102 is guided laterally through the Hall effect region during a first clock phase PH1 in a direction at 0° with respect to a normal to the primary flat plane, e.g., in the case of a {100} silicon substrate in the [110] direction. In a second clock phase PH2, the Hall supply current 102 is then guided laterally through the Hall effect region in a direction at 90° with respect to a normal to the primary flat plane, e.g., in the case of a {100} silicon substrate in the [1̄10] direction.

The flow of the Hall supply current 102 here again also generates an electrical voltage in the Hall effect region of the integrated Hall sensor circuit 101. This electrical voltage can be accessed in the form of an electrical voltage signal at, for example, two of the total of four terminals 111, 112, 113, 114. An electrical voltage signal in the form of a Hall output voltage $V_{Hallout}$ can, for example, be accessed at the two terminals at which the Hall supply current 102 is not fed in. On the other hand, an electrical voltage signal in the form of a Hall bias voltage $V_{Hallbias}$ can be accessed at the terminals at which the Hall supply current 102 is fed in.

A first voltage signal $V_{Hallout}(PH_{spin1})$ or $V_{Hallbias}(PH_{spin1})$ can accordingly be accessed in the first clock phase PH1, and a second voltage signal $V_{Hallout}(PH_{spin2})$ or $V_{Hallbias}(PH_{spin2})$ can accordingly be accessed in the second clock phase PH2. The first voltage signal $V_{Hallout}(PH_{spin1})$ or $V_{Hallbias}(PH_{spin1})$ has a first dependency on a mechanical stress of the semiconductor substrate, and the second voltage signal $V_{Hallout}(PH_{spin2})$ or $V_{Hallbias}(PH_{spin2})$ has a different, second dependency on a mechanical stress of the semiconductor substrate.

Expressed more generally, the Hall sensor circuit 101 according to the subject matter described herein, is configured to guide a Hall supply current 102 between the first terminal 111 and the opposite, second terminal 112 at a first angle $\Phi_1$ to a normal to a primary flat plane of the semiconductor substrate, laterally through a Hall effect region during a first clock phase $PH_{spin1}$, and to generate a first electrical voltage signal $V_{Hallout}(PH_{spin1})$ or $V_{Hallbias}(PH_{spin1})$ in the Hall effect region, wherein the first electrical voltage signal $V_{Hallout}(PH_{spin1})$ or $V_{Hallbias}(PH_{spin1})$ has a first dependency on a mechanical stress of the semiconductor substrate. In the case of FIG. 8A, the first angle is $\Phi_1=+45°$, and in the case of FIG. 8B the first angle is $\Phi_1=0°$.

The Hall sensor circuit 101 is furthermore configured to guide a Hall supply current 102 between the third terminal 113 and the opposite, fourth terminal 114 at a second angle $\Phi_2$ that is orthogonal to the first angle $\Phi_1$, laterally through the Hall effect region during a second clock phase $PH_{spin2}$, and to generate a second electrical voltage signal $V_{Hallout}(PH_{spin2})$ or $V_{Hallbias}(PH_{spin2})$ in the Hall effect region, wherein the second electrical voltage signal $V_{Hallout}(PH_{spin2})$ or $V_{Hallbias}(PH_{spin2})$ has a second dependency on a mechanical stress of the semiconductor substrate. In the case of FIG. 8A, the second angle is $\Phi_2=-45°$, and in the case of FIG. 8B the second angle is $\Phi_2=90°$.

According to the example implementation illustrated in FIG. 8A, the semiconductor circuit arrangement 100 is furthermore configured to ascertain a specific mechanical stress component, in this case an aggregate mechanical stress, $(\sigma_{xx}+\sigma_{yy})$, and to do so based on a combination of the first electrical voltage signal $V_{Hallout}(PH_{spin1})$ or $V_{Hallbias}(PH_{spin1})$ and of the second electrical voltage signal $V_{Hallout}(PH_{spin2})$ or $V_{Hallbias}(PH_{spin2})$. According to the example implementation illustrated in FIG. 8B, the semiconductor circuit arrangement 100 is configured to ascertain a specific mechanical stress component, in this case a mechanical shear stress $\sigma_{xy}$, and to do so based on a combination of the first electrical voltage signal $V_{Hallout}(PH_{spin1})$ or $V_{Hallbias}(PH_{spin1})$ and of the second electrical voltage signal $V_{Hallout}(PH_{spin2})$ or $V_{Hallbias}(PH_{spin2})$.

In FIGS. 8A and 8B a Hall output voltage $V_{Hallout}(PH_{spin1})$ or $V_{Hallout}(PH_{spin2})$ is accessed in each case during both the first clock phase PH1 and the second clock phase PH2 at whichever terminals the Hall supply current 102 is not being fed in. This means that a first electrical voltage signal is accessed in the form of a first Hall output voltage $V_{Hallout}(PH_{spin1})$ at the third terminal 113 and at the fourth terminal 114 during the first clock phase PH1, and a second electrical voltage signal in the form of a second Hall output voltage $V_{Hallout}(PH_{spin2})$ is accessed at the first terminal 111 and at the second terminal 112 during the second clock phase PH2.

The first electrical voltage signal $V_{Hallout}(PH_{spin1})$ accessed during the first clock phase PH1 depends on the magnetic field component $B_z$ as well as on what is known as the aggregate mechanical stress, e.g. on the sum of the normal stress components in the x and y directions $(\sigma_{xx}+\sigma_{yy})$, and on what is known as the difference mechanical stress, e.g. on the difference between the normal stress components in the x and y directions $(\sigma_{xx}-\sigma_{yy})$. The first electrical voltage signal $V_{Hallout}(PH_{spin1})$ is, however, independent of a shear stress component. The dependency on the normal stress component in the z direction $\sigma_{zz}$ is also negligible. The difference stress $(\sigma_{xx}-\sigma_{yy})$ here has a negative arithmetic sign during the first clock phase PH1, which means:

$$V_{Hallout}(PH_{spin1})=f(B_z, (\sigma_{xx}+\sigma_{yy}), -(\sigma_{xx}-\sigma_{yy})).$$

The first voltage signal $V_{Hallout}(PH_{spin1})$ thus accordingly has a first dependency on a mechanical stress of the semiconductor substrate.

The second electrical voltage signal $V_{Hallout}(PH_{spin2})$ accessed during the second clock phase PH2 likewise depends on the magnetic field component $B_z$ as well as on the aggregate mechanical stress, e.g. on the sum of the normal stress components in the x and y directions $(\sigma_{xx}+\sigma_{yy})$, and on the difference mechanical stress, e.g. on the difference between the normal stress components in the x and y directions $(\sigma_{xx}-\sigma_{yy})$. The second electrical voltage signal $V_{Hallout}(PH_{spin2})$ is also independent of a shear stress component, while the dependency on the normal stress component in the z direction $\sigma_{zz}$ is also negligible. The mechanical difference stress $(\sigma_{xx}-\sigma_{yy})$ here however has a positive arithmetic sign during the second clock phase PH2, meaning that:

$$V_{Hallout}(PH_{spin2})=f(B_z,(\sigma_{xx}+\sigma_{yy}), +(\sigma_{xx}-\sigma_{yy})).$$

The second voltage signal $V_{Hallout}(PH_{spin2})$ thus accordingly has a second dependency on a mechanical stress of the semiconductor substrate.

According to the example implementation shown here in FIG. 8A, the combination of the two electrical voltage signals $V_{Hallout}(PH_{spin1})$ and $V_{Hallout}(PH_{spin2})$ explained previously can now be made by forming a sum or an average. This means that the semiconductor circuit arrangement 100 can be configured to form a sum or an average of the first voltage signal $V_{Hallout}(PH_{spin1})$ and the second voltage signal $V_{Hallout}(PH_{spin2})$, meaning that:

$$(V_{Hallout}(PH_{spin1})+V_{Hallout}(PH_{spin2}))/2=f(B_z, (\sigma_{xx}+\sigma_{yy}).$$

It can be seen that the difference stress $(\sigma_{xx}-\sigma_{yy})$ is canceled out. What remains is the dependency on the aggregate mechanical stress $(\sigma_{xx}+\sigma_{yy})$ explained previously and on the magnetic field component $B_z$. A mechanical normal stress component, namely the aggregate mechanical stress $(\sigma_{xx}+\sigma_{yy})$, can thus be ascertained in this form of implementation using forming the sum or average.

Using the variant shown in FIG. 8B, a mechanical shear stress component $\sigma_{xy}$ can be ascertained using forming a sum or average. The Hall output voltage $V_{Hallout}$ can likewise be used for this purpose in the form of implementation shown in FIG. 8B. This means that in FIG. 8B again the first voltage signal is accessed between the terminals in the form of the Hall output voltage $V_{Hallout}(PH_{spin1})$ during the first clock phase $PH_{spin1}$, during which the Hall supply current 102 is not being fed in, e.g. between the third terminal 113 and the fourth terminal 114. The second voltage signal is accessed between the terminals in the form of the Hall output voltage $V_{Hallout}(PH_{spin2})$ during the second clock phase $PH_{spin2}$, during which the Hall supply current 102 is not being fed in, e.g. between the first terminal 111 and the second terminal 112.

The first electrical voltage signal $V_{Hallout}(PH_{spin1})$ accessed in the first clock phase PH1 depends on the magnetic field component $B_z$, on the aggregate stress, e.g. on a sum of the normal stress components $(\sigma_{xx}+\sigma_{yy})$, and on a shear stress component $\sigma_{xy}$. It is, however, independent of the difference mechanical stress, e.g. on a difference of the normal stress components $(\sigma_{xx}-\sigma_{yy})$ and of a normal mechanical stress component in the z direction, e.g. of the normal stress $\sigma_{zz}$. The mechanical shear stress component $\sigma_{xy}$ here has a negative arithmetic sign during the first clock phase PH1, which means:

$$V_{Hallout}(PH_{spin1}) = f(B_z, (\sigma_{xx}+\sigma_{yy}), -\sigma_{xy}).$$

The first voltage signal $V_{Hallout}(PH_{spin1})$ thus accordingly has a first dependency on a mechanical stress of the semiconductor substrate.

The second electrical voltage signal $V_{Hallout}(PH_{spin2})$ accessed in the second clock phase PH2 likewise depends on the magnetic field component $B_z$, on the aggregate stress, e.g. on a sum of the normal stress components $(\sigma_{xx}+\sigma_{yy})$, and on a shear stress component $\sigma_{xy}$. It is, however, independent of the difference mechanical stress, e.g. on a difference of the normal stress components $(\sigma_{xx}-\sigma_{yy})$ and of a normal mechanical stress component in the z direction, e.g. of the normal stress $\sigma_{zz}$. The mechanical shear stress component $\sigma_{xy}$ here however has a positive arithmetic sign during the first clock phase PH1, which means:

$$V_{Hallout}(PH_{spin1}) = f(B_z, (\sigma_{xx}+\sigma_{yy}), +\sigma_{xy}).$$

The second voltage signal $V_{Hallout}(PH_{spin2})$ thus accordingly has a second dependency on a mechanical stress of the semiconductor substrate.

According to the example implementation shown here in FIG. 8B, the combination of the two electrical voltage signals $V_{Hallout}(PH_{spin1})$ and $V_{Hallout}(PH_{spin2})$ explained previously can now once again be made by forming a sum or an average. This means that the semiconductor circuit arrangement 100 can be configured to form a sum or an average of the first voltage signal $V_{Hallout}(PH_{spin1})$ and the second voltage signal $V_{Hallout}(PH_{spin2})$, meaning that:

$$V_{Hallout}(PH_{spin1}) - V_{Hallout}(PH_{spin2}) = f(B_z, \sigma_{xy}).$$

The difference stress $(\sigma_{xx}-\sigma_{yy})$ here again cancels out. What remains is the dependency on the mechanical shear stress component $\sigma_{xy}$ explained previously and on the magnetic field component $B_z$. A mechanical shear stress component $\sigma_{xy}$ can thus be ascertained in this form of implementation using forming the sum or average.

Figure 8C:
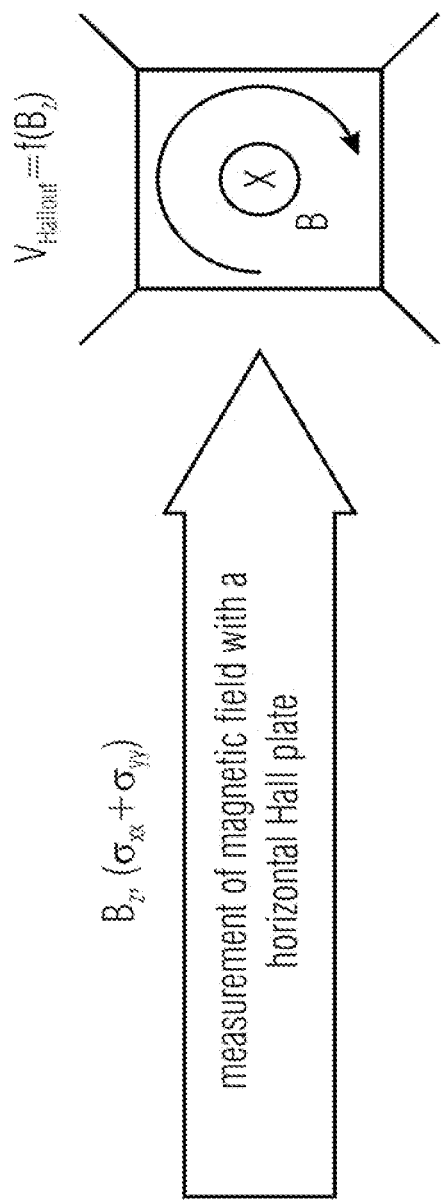
FIG. 8C shows a schematic view to illustrate the Hall sensor circuit that is configured to measure a magnetic field with the compensation of an initial offset error.

As is shown in FIG. 8C, this can be used to measure a magnetic field component $B_z$ using the Hall sensor circuit 101, and to compensate for an initial offset error.

FIG. 9 shows a schematic block diagram of a method according to the subject matter described herein.

In block 901 a Hall supply current 102 is applied during a first clock phase $PH_{spin1}$, this being done between the first terminal 111 and the opposite, second terminal 112 in order to guide the Hall supply current 102 at a first angle $\Phi_1$ (e.g. $\Phi_1 = +45°$ or $\Phi_1 = 0°$) to a normal to a primary flat plane of the semiconductor substrate, laterally through a Hall effect region of the Hall sensor circuit 101, wherein the Hall supply current 102 generates a first electrical voltage signal $V_{Hallout}(PH_{spin1})$ or $V_{Hallbias}(PH_{spin1})$ in the Hall effect region, wherein the first electrical voltage signal $V_{Hallout}(PH_{spin1})$ or $V_{Hallbias}(PH_{spin1})$ has a first dependency on a mechanical stress of the semiconductor substrate.

In block 902 a Hall supply current 102 is applied during a second clock phase $PH_{spin2}$, this being done between the third terminal 113 and the opposite, fourth terminal 114 in order to guide the Hall supply current 102 at a second angle $\Phi_2$ (e.g. $\Phi_2 = -45°$ or $\Phi_2 = 90°$) that is orthogonal to the first angle $\Phi_1$ (e.g. $\Phi_1 = +45°$ or $\Phi_1 = 0°$), laterally through the Hall effect region of the Hall sensor circuit 101, wherein the Hall supply current 102 generates a second electrical voltage signal $V_{Hallout}(PH_{spin2})$ or $V_{Hallbias}(PH_{spin2})$ in the Hall effect region, wherein the second electrical voltage signal $V_{Hallout}(PH_{spin2})$ or $V_{Hallbias}(PH_{spin2})$ has a second dependency on a mechanical stress of the semiconductor substrate.

In block 903 a specific mechanical stress component is ascertained, this being done based on a combination of the first electrical voltage signal ($V_{Hallout}(PH_{spin1})$ or $V_{Hallbias}(PH_{spin1})$) and of the second electrical voltage signal ($V_{Hallout}(PH_{spin2})$ or $V_{Hallbias}(PH_{spin2})$).

According to the subject matter described herein, the lateral Hall plate 101 or the integrated Hall sensor circuit 101 can thus be employed both for the measurement of a magnetic field as well as for the measurement of stress. The results of the stress measurement can be used for the compensation of parametric inaccuracies of other components or circuits.

Angle sensors based on the Hall effect can, for example, have an orthogonality error resulting from shear stress, which can be compensated for by compensating the shear stress. Additional on-chip oscillators can have frequency deviations or frequency inaccuracies that can be traced back to difference mechanical stresses of in-plane stress components, e.g. to a difference between mechanical normal stress components in the x and y directions. A magnetic 3D sensor can have measurement inaccuracies that can be traced back to aggregate mechanical stresses of in-plane stress components, e.g. to a sum of mechanical normal stress components in the x and y directions.

The concept described herein can be summarized as follows:
  Multiple use of a horizontal Hall plate for the measurement of:
    a magnetic signal
    and additional mechanical stress components
      aggregate stress $(\sigma_{xx}+\sigma_{yy})$
      difference stress $(\sigma_{xx}-\sigma_{yy})$
      shear stress $\sigma_{xy}$
    for compensation of the sensitivity of a horizontal Hall plate
    and/or for compensating the vertical Hall devices of an angle sensor or magnetic 3D sensor,
    and/or compensating for aggregate stress dependent, difference stress dependent or shear stress dependent on-chip oscillators
    magnetic current sensors
    other circuits (e.g. bandgaps) and sensors
  Carrying out measurements in one or a plurality of spinning phases of a horizontal Hall plate:
    in order to ascertain the difference
    in order to ascertain the sum (or mean value) of the measurements from different spinning phases
  Primary advantages:
    multiple use of one sensor for self-correction or for the correction of other sensors and/or circuits
    less chip area
    lower energy consumption
    increased precision of all on-chip circuits
The concept described herein can be used in particular for the purposes of a system calibration.

The example implementations described above only represent an exemplification of the principles of the subject matter described herein. It is obvious that modifications and variations of the arrangements and details described herein will be clear to other specialists. It is therefore intended that the concept described herein will only be restricted by the scope of protection of the following patent claims, and not by the specific details that have been presented here with reference to the description and the explanation of the example implementations.

Although some aspects have been described in connection with a device, it is clear that these aspects also represent a description of the corresponding method, so that a block or a component of a device is also to be understood as a corresponding method step or as a feature of a method step. Aspects that have been described in connection with a method step or as such a step analogously also represent a description of a corresponding block or detail or feature of a corresponding device.

Some or all of the method steps can be carried out by a hardware apparatus (or making use of a hardware apparatus), such as for example a microprocessor, a programmable computer, or an electronic circuit. In some example implementations, some or a plurality of the most important method steps can be carried out by such an apparatus.

Depending on specific implementations, example implementations can be implemented in hardware or in software or at least partially in hardware or at least partially in software. The implementation can be carried out making use of a digital storage medium, for example a floppy disk, a DVD, a Blu-ray disk, a CD, a ROM, a PROM, an EPROM, an EEPROM or a FLASH memory, a hard disk or another magnetic or optical store on which electronically readable control signals are stored that can or do interact together with a programmable computer system in such a way that the respective method is carried out. The digital storage medium can therefore be computer-readable.

Some example implementations thus comprise a data carrier that comprises electronically readable control signals that are capable of interacting with a programmable computer system in such a way that one of the methods described herein is carried out.

Example implementations can in general be implemented as a computer program product with program code, wherein the program code is effective in carrying out one of the methods when the computer program product is executed on a computer.

The program code can for example also be stored on a machine-readable carrier.

Other example implementations comprise the computer program for carrying out one of the methods described here, wherein the computer program is stored on a machine-readable carrier. In other words, an example implementation of the method described herein is thus a computer program that comprises program code for carrying out one of the methods described herein when the computer program is executed on a computer.

A further example implementation of the method described herein is thus a data carrier (or a digital storage medium or a computer-readable medium) on which the computer program for carrying out one of the methods described here is recorded. The data carrier or the digital storage medium or the computer-readable medium are typically tangible and/or not volatile.

A further example implementation of the method described herein is thus a data stream or a sequence of signals that represents or represent the computer program for carrying out one of the methods described herein. The data stream or the sequence of signals can for example be configured to be transferred over a data communication connection, for example over the Internet.

A further example implementation comprises a processing device, for example a computer or a programmable logic component, that is configured or adapted to carry out one of the methods described herein.

A further example implementation comprises a computer on which the computer program for carrying out one of the methods described herein is installed.

A further example implementation comprises a device or system that is configured to transmit a computer program for carrying out at least one of the methods described herein to a receiver. The transmission can for example take place electronically or optically. The receiver can for example be a computer, a mobile device, a storage device or a similar apparatus. The device or the system can for example comprise a data server for transmitting the computer program to the receiver.

In some example implementations, a programmable logic component (for example a field programmable gate array, an FPGA), can be used to carry out some or all of the functionalities of the methods described herein. In some example implementations, a field programmable gate array can interact with a microprocessor in order to carry out one of the methods described herein. In general, in some example implementations, the methods are carried out by an arbitrary hardware device. This can be a universally usable hardware such as a computer processor (CPU), or hardware specifically for the method, such as for example an ASIC.

The invention claimed is:

1. A semiconductor circuit arrangement with a semiconductor substrate,
   wherein the semiconductor substrate comprises an integrated Hall sensor circuit with a first terminal and a second terminal positioned opposite the first terminal, and a third terminal and a fourth terminal positioned opposite the third terminal, wherein the integrated Hall sensor circuit is configured to:
      guide a Hall supply current between the first terminal and the second terminal at a first angle to a normal to a primary flat plane of the semiconductor substrate, laterally through a Hall effect region during a first clock phase, and to generate a first electrical voltage signal in the Hall effect region, wherein the first electrical voltage signal has a first dependency on a mechanical stress of the semiconductor substrate, and
      guide a Hall supply current between the third terminal and the fourth terminal at a second angle that is orthogonal to the first angle, laterally through the Hall effect region during a second clock phase, and to generate a second electrical voltage signal in the Hall effect region, wherein the second electrical voltage signal has a second dependency on the mechanical stress of the semiconductor substrate, and
   wherein the semiconductor circuit arrangement is configured to ascertain a specific mechanical stress component based on a combination of the first electrical voltage signal and of the second electrical voltage signal.

2. The semiconductor circuit arrangement as claimed in claim 1,
   wherein the semiconductor circuit arrangement is further configured to use the specific mechanical stress component ascertained using the integrated Hall sensor circuit to compensate for a negative influence of the specific mechanical stress component on at least one of a parametric accuracy or parametric stability of a component that is arranged on the semiconductor substrate but is separate from the integrated Hall sensor circuit or of a further circuit arrangement integrated into the semiconductor substrate.

3. The semiconductor circuit arrangement as claimed in claim 1,
wherein the first angle has a value of +45° to the normal to the primary flat plane of the semiconductor substrate, and wherein the second angle has a value of −45° to the normal to the primary flat plane of the semiconductor substrate.

4. The semiconductor circuit arrangement as claimed in claim 1,
wherein the semiconductor substrate is a semiconductor substrate, and wherein the integrated Hall sensor circuit is configured to guide the Hall supply current during the first clock phase $PH_{spin1}$ in a [100], [010], [$\bar{1}$00] or [0$\bar{1}$0] direction laterally through the Hall effect region, and during the second clock phase to guide the Hall supply current in a [100], [010], [$\bar{1}$00] or [0$\bar{1}$0] direction that is respectively orthogonal to the first clock phase laterally through the Hall effect region.

5. The semiconductor circuit arrangement as claimed in claim 3,
wherein the integrated Hall sensor circuit is configured to use a voltage drop between the first terminal and the second terminal during the first clock phase as a first voltage signal, and to use a voltage drop between the third terminal and the fourth terminal as a second voltage signal during the second clock phase, and
wherein the semiconductor circuit arrangement is configured to form a difference between the first and second electrical voltage signals and to ascertain a mechanical shear stress component in the semiconductor substrate on that basis.

6. The semiconductor circuit arrangement as claimed in claim 3,
wherein the integrated Hall sensor circuit is configured to use a voltage drop between the first terminal and the second terminal during the first clock phase as a first voltage signal, and to use a voltage drop between the third terminal and the fourth terminal as a second voltage signal during the second clock phase, and
wherein the semiconductor circuit arrangement is configured to form a sum of the first and second electrical voltage signals and to ascertain a mechanical normal stress component in the semiconductor substrate on that basis.

7. The semiconductor circuit arrangement as claimed in claim 3,
wherein the integrated Hall sensor circuit is configured to use a voltage drop between the third terminal and the fourth terminal during the first clock phase $PH_{spin1}$ as a first voltage signal, and to use a voltage drop between the first terminal and the second terminal as a second voltage signal during the second clock phase, and
wherein the semiconductor circuit arrangement is configured to form a difference between the first and second electrical voltage signals and to ascertain a mechanical normal stress component in the semiconductor substrate on that basis.

8. The semiconductor circuit arrangement as claimed in claim 1,
wherein the first angle has a value of 0° to the normal to the primary flat plane of the semiconductor substrate, and wherein the second angle has a value of 9020 to the normal to the primary flat plane of the semiconductor substrate.

9. A semiconductor circuit arrangement as claimed in claim 1,
wherein the semiconductor substrate is a semiconductor substrate, and wherein the integrated Hall sensor circuit is configured to guide the Hall supply current during the first clock phase in a [110], [$\bar{1}$10], [1$\bar{1}$0] or [$\bar{1}\bar{1}$0] direction laterally through the Hall effect region, and during the second clock phase to guide the Hall supply current in a [110], [$\bar{1}$10], [1$\bar{1}$0] or [$\bar{1}\bar{1}$0] direction that is respectively orthogonal to the first clock phase laterally through the Hall effect region.

10. The semiconductor circuit arrangement as claimed in claim 8,
wherein the integrated Hall sensor circuit is configured to use a voltage drop between the first terminal and the second terminal during the first clock phase $PH_{spin1}$ as a first voltage signal, and to use a voltage drop between the third terminal and the fourth terminal as a second voltage signal during the second clock phase, and
wherein the semiconductor circuit arrangement is configured to form a difference between the first electrical voltage signal and the second electrical voltage signal and to ascertain a mechanical normal stress component in the semiconductor substrate on that basis.

11. The semiconductor circuit arrangement as claimed in claim 8,
wherein the integrated Hall sensor circuit is configured to use a voltage drop between the third terminal and the fourth terminal as a first voltage signal during the first clock phase, and to use a voltage drop between the first terminal and the second terminal as a second voltage signal during the second clock phase, and
wherein the semiconductor circuit arrangement is configured to form a difference between the first electrical voltage signal and the second electrical voltage signal and to ascertain a mechanical shear stress component in the semiconductor substrate on that basis.

12. The semiconductor circuit arrangement as claimed in claim 8,
wherein the integrated Hall sensor circuit is configured to use a voltage drop between the first terminal and the second terminal as a first voltage signal during the first clock phase, and to use a voltage drop between the third terminal and the fourth terminal as a second voltage signal during the second clock phase, and
wherein the semiconductor circuit arrangement is configured to form a sum of the first and second electrical voltage signals and to ascertain a mechanical normal stress component in the semiconductor substrate on that basis.

13. The semiconductor circuit arrangement as claimed in claim 5,
wherein the semiconductor circuit arrangement is configured to compensate an orthogonality error of a Hall effect-based angle sensor, separate from the integrated Hall sensor circuit, with a horizontal Hall plate and a vertical Hall device based on the ascertained mechanical shear stress component.

14. The semiconductor circuit arrangement as claimed in claim 6,
wherein the semiconductor circuit arrangement is configured to increase a sensitivity, that depends on a mechanical normal stress, of a horizontal Hall plate separate from the integrated Hall sensor circuit based on the ascertained mechanical normal stress component.

15. The semiconductor circuit arrangement as claimed in claim 7,
wherein the semiconductor circuit arrangement is configured to compensate a frequency deviation, that depends on a mechanical normal stress, of an oscillator mounted on the semiconductor substrate together with the integrated Hall sensor circuit, or to increase a sensitivity, that depends on a mechanical normal stress, of a magnetic current sensor separate from the integrated Hall sensor circuit, based on the ascertained mechanical normal stress component.

16. A method for ascertaining a mechanical stress component using a semiconductor circuit arrangement with a semiconductor substrate and a Hall sensor circuit integrated therein,
wherein the Hall sensor circuit comprises a first terminal and a second terminal positioned opposite the first terminal, and as a third terminal and a fourth terminal positioned opposite the third terminal,
and wherein the method comprises:
applying a Hall supply current during a first clock phase between the first terminal and the second terminal to guide the Hall supply current at a first angle to a normal to a primary flat plane of the semiconductor substrate, laterally through a Hall effect region of the Hall sensor circuit, wherein the Hall supply current generates a first electrical voltage signal in the Hall effect region, wherein the first electrical voltage signal has a first dependency on a mechanical stress of the semiconductor substrate, and
applying a Hall supply current during a second clock phase between the third terminal and the fourth terminal to guide the Hall supply current at a second angle that is orthogonal to the first angle, laterally through the Hall effect region of the Hall sensor circuit, wherein the Hall supply current generates a second electrical voltage signal in the Hall effect region, and wherein the second electrical voltage signal has a second dependency on the mechanical stress of the semiconductor substrate, and
ascertaining the mechanical stress component based on a combination of the first electrical voltage signal and of the second electrical voltage signal.

17. A computer program with program code for carrying out the method as claimed in claim 16 when the computer program is executed on a computer.

18. The method of claim 16, further comprising:
compensating, based on using the mechanical stress component, for a negative influence of the mechanical stress component on at least one of a parametric accuracy or parametric stability of a component that is arranged on the semiconductor substrate but is separate from the Hall sensor circuit or of a further circuit arrangement integrated into the semiconductor substrate.

19. The method of claim 16, wherein the first angle has a value of +45° to the normal to the primary flat plane of the semiconductor substrate, and wherein the second angle has a value of −45° to the normal to the primary flat plane of the semiconductor substrate.

20. The method of claim 19, wherein the Hall sensor circuit is configured to use a voltage drop between the third terminal and the fourth terminal during the first clock phase $PH_{spin1}$ as a first voltage signal, and to use a voltage drop between the first terminal and the second terminal as a second voltage signal during the second clock phase, and
wherein the semiconductor circuit arrangement is configured to form a difference between the first electrical voltage signal and the second electrical voltage signal and to ascertain a mechanical normal stress component in the semiconductor substrate on that basis.

\* \* \* \* \*